(12) United States Patent
DiBene, II et al.

(10) Patent No.: US 7,245,507 B2
(45) Date of Patent: Jul. 17, 2007

(54) METHOD AND APPARATUS FOR PROVIDING POWER TO A MICROPROCESSOR WITH INTEGRATED THERMAL AND EMI MANAGEMENT

(76) Inventors: Joseph T. DiBene, II, 19 Shasta Ct., Oceanside, CA (US) 90257; David H. Hartke, 3647 Tarpon Dr., Lake Havasu City, AZ (US) 86403; James J. Hjerpe Kaskade, 620 Solana Cir. West #A2, Solana Beach, CA (US) 92075; Carl E. Hoge, 11265 Affinity Ct. #108, San Diego, CA (US) 92131

( * ) Notice: Subject to any disclaimer, the term of this patent is extended or adjusted under 35 U.S.C. 154(b) by 236 days.

(21) Appl. No.: 10/201,384

(22) Filed: Jul. 23, 2002

(65) Prior Publication Data

US 2002/0196614 A1    Dec. 26, 2002

Related U.S. Application Data

(63) Continuation of application No. 09/785,892, filed on Feb. 16, 2001, now Pat. No. 6,452,113, and a continuation-in-part of application No. 09/727,016, filed on Nov. 28, 2000, now abandoned, and a continuation-in-part of application No. 09/432,878, filed on Nov. 2, 1999, now Pat. No. 6,356,448, and a continuation-in-part of application No. 09/353,428, filed on Jul. 15, 1999, now Pat. No. 6,304,450.

(60) Provisional application No. 60/266,941, filed on Feb. 6, 2001, provisional application No. 60/251,222, filed on Dec. 4, 2000, provisional application No. 60/251,223, filed on Dec. 4, 2000, provisional application No. 60/251,184, filed on Dec. 4, 2000, provisional application No. 60/232,971, filed on Sep. 14, 2000, provisional application No. 60/222,386, filed on Aug. 2, 2000, provisional application No. 60/222,407, filed on Aug. 2, 2000, provisional application No. 60/219,813, filed on Jul. 21, 2000, provisional application No. 60/219,506, filed on Jul. 20, 2000, provisional application No. 60/196,059, filed on Apr. 10, 2000, provisional application No. 60/187,777, filed on Mar. 8, 2000, provisional application No. 60/186,769, filed on Mar. 3, 2000, provisional application No. 60/183,474, filed on Feb. 18, 2000, provisional application No. 60/171,065, filed on Dec. 16, 1999, provisional application No. 60/167,792, filed on Nov. 29, 1999.

(51) Int. Cl.
*H05K 7/06*    (2006.01)

(52) U.S. Cl. .................................... 361/803; 257/691

(58) Field of Classification Search ............... 361/767, 361/768, 771, 780, 782–785, 788, 790, 791, 361/794, 803, 804, 761, 764; 257/686, 691, 257/723, 724, 728, 778

See application file for complete search history.

(56) References Cited

U.S. PATENT DOCUMENTS

| | | |
|---|---|---|
| 4,498,530 A | 2/1985 | Lipschutz |
| 4,521,829 A | 6/1985 | Wessely |
| 4,589,057 A | 5/1986 | Short |
| 4,742,385 A | 5/1988 | Kohmoto |
| 4,760,495 A | 7/1988 | Till |
| 4,771,365 A | 9/1988 | Cichocki et al. |
| 4,942,497 A | 7/1990 | Mine et al. |
| 4,982,311 A | 1/1991 | Dehaine et al. |
| 5,052,481 A | 10/1991 | Horvath et al. |
| 5,161,089 A | 11/1992 | Chu et al. |
| 5,195,020 A | 3/1993 | Suzuki et al. |
| 5,272,599 A | 12/1993 | Koenen |
| 5,315,069 A | 5/1994 | Gebara |
| 5,331,510 A | 7/1994 | Ouchi et al. |
| 5,343,358 A | 8/1994 | Hilbrink |
| 5,365,402 A | 11/1994 | Hatada et al. |
| 5,380,211 A | 1/1995 | Kawaguchi et al. |
| 5,390,078 A | 2/1995 | Taylor |
| 5,396,403 A | 3/1995 | Patel |
| 5,409,055 A | 4/1995 | Tanaka et al. |
| 5,444,298 A * | 8/1995 | Schutz ................... 257/691 |
| 5,467,251 A | 11/1995 | Katchmar |
| 5,473,510 A | 12/1995 | Dozier, II |
| 5,504,924 A | 4/1996 | Ohashi et al. |

| | | | |
|---|---|---|---|
| 5,510,958 A | 4/1996 | Shimabara et al. | |
| 5,515,912 A | 5/1996 | Daikoku et al. | |
| 5,586,011 A | 12/1996 | Alexander | |
| 5,619,399 A | 4/1997 | Mok | |
| 5,621,615 A | 4/1997 | Dawson et al. | |
| 5,646,826 A | 7/1997 | Katchmar | |
| 5,661,902 A | 9/1997 | Katchmar | |
| 5,694,297 A * | 12/1997 | Smith et al. | 361/785 |
| 5,708,566 A | 1/1998 | Hunninghaus et al. | |
| 5,729,433 A | 3/1998 | Mok | |
| 5,734,555 A | 3/1998 | McMahon | |
| 5,761,043 A | 6/1998 | Salmonson | |
| 5,794,454 A | 8/1998 | Harris et al. | |
| 5,796,582 A | 8/1998 | Katchmar | |
| 5,801,924 A | 9/1998 | Salmonson | |
| 5,815,921 A | 10/1998 | Burward-Hoy | |
| 5,825,630 A | 10/1998 | Taylor et al. | |
| 5,825,633 A | 10/1998 | Bujalski et al. | |
| 5,842,514 A | 12/1998 | Zapach et al. | |
| 5,856,911 A | 1/1999 | Riley | |
| 5,864,478 A | 1/1999 | McCutchan et al. | |
| 5,898,573 A | 4/1999 | Fugaro | |
| 5,905,638 A | 5/1999 | MacDonald, Jr. et al. | |
| 5,920,458 A | 7/1999 | Azar | |
| 5,930,115 A | 7/1999 | Tracy et al. | |
| 5,966,294 A | 10/1999 | Harada et al. | |
| 5,980,267 A | 11/1999 | Ayers et al. | |
| 5,981,869 A | 11/1999 | Kroger | |
| 5,986,887 A | 11/1999 | Smith et al. | |
| 5,995,370 A | 11/1999 | Nakamori | |
| 6,018,465 A | 1/2000 | Borkar et al. | |
| 6,092,281 A | 7/2000 | Glenn | |
| 6,137,693 A | 10/2000 | Schwiebert et al. | |
| 6,157,544 A | 12/2000 | Ferling et al. | |
| 6,181,008 B1 * | 1/2001 | Avery et al. | 257/723 |
| 6,191,475 B1 | 2/2001 | Skinner et al. | |
| 6,222,265 B1 | 4/2001 | Akram et al. | |
| 6,225,566 B1 | 5/2001 | Dienst | |
| 6,265,672 B1 | 7/2001 | Eum et al. | |
| 6,272,741 B1 * | 8/2001 | Kennedy et al. | 29/830 |
| 6,297,551 B1 | 10/2001 | Dudderar et al. | |
| 6,303,989 B1 * | 10/2001 | Yasuho et al. | 257/706 |
| 6,359,783 B1 * | 3/2002 | Noble | 361/704 |
| 6,424,034 B1 * | 7/2002 | Ahn et al. | 257/723 |

FOREIGN PATENT DOCUMENTS

| | | |
|---|---|---|
| EP | 0 582 145 A1 | 2/1994 |
| EP | 0 717 443 A1 | 6/1996 |
| EP | 0 920 055 A2 | 6/1999 |
| FR | 2 722 334 A1 | 1/1996 |
| JP | 08330699 | 12/1996 |
| JP | 1174427 | 3/1999 |
| WO | WO 96/23397 | 8/1996 |
| WO | WO 01/06821 A1 | 1/2001 |
| WO | PCT/US 00/29452 | 3/2001 |
| WO | WO 01/33927 A1 | 5/2001 |

OTHER PUBLICATIONS

XP000124263, IBM Tech Disc Bulletin, "Multiple Electronic Board . . . System," 1990, 33(3B):55-56.

* cited by examiner

Primary Examiner—John B. Vigushin

(57) ABSTRACT

A microprocessor packaging architecture using a modular circuit board assembly that provides power to a microprocessor while also providing for integrated thermal and electromagnetic interference (EMI) is disclosed. The modular circuit board assembly comprises a substrate, having a component mounted thereon, a circuit board, including a circuit for supplying power to the component, and at least one conductive interconnect device disposed between the substrate and the circuit board, the conductive interconnect device configured to electrically couple the circuit to the component.

14 Claims, 36 Drawing Sheets

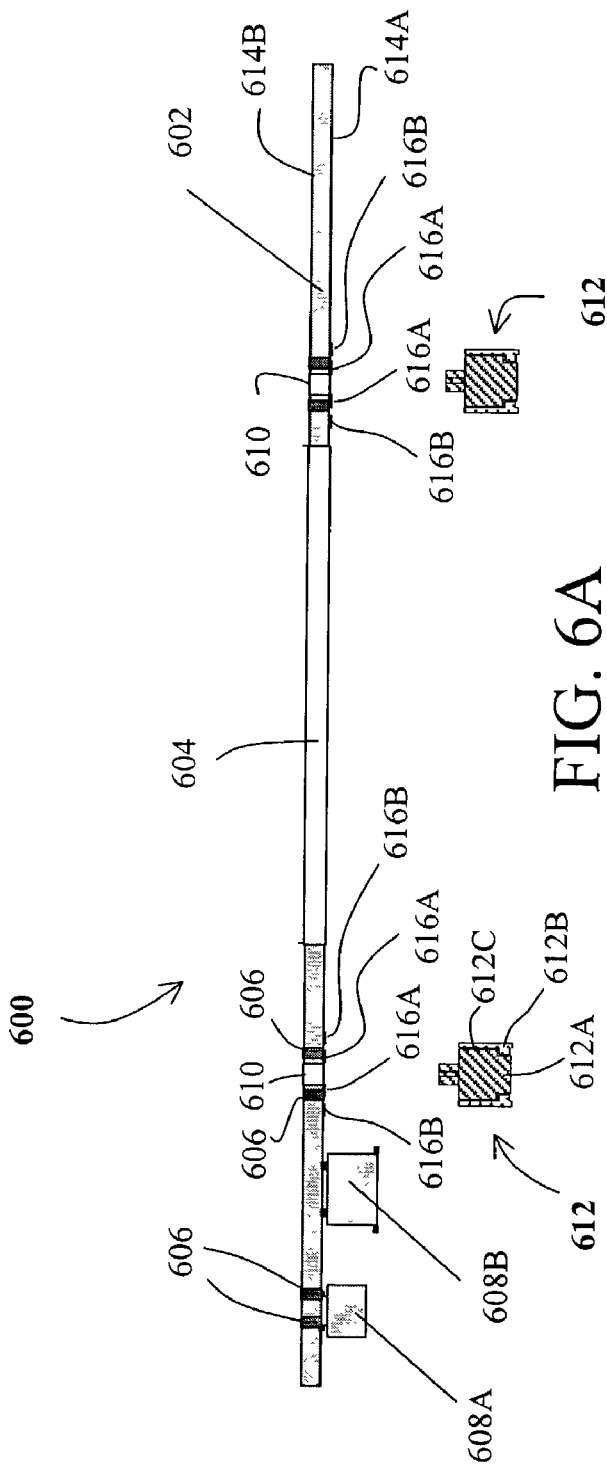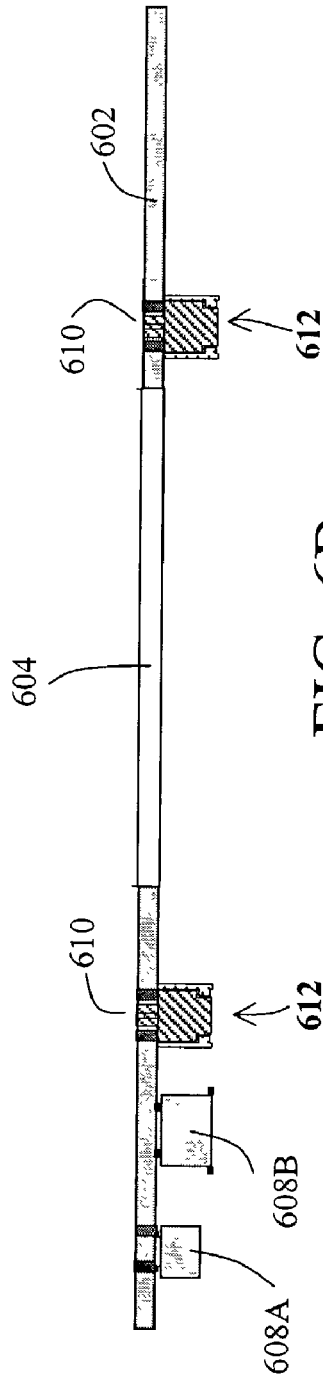
FIG. 6A
FIG. 6B

METHOD AND APPARATUS FOR PROVIDING POWER TO A MICROPROCESSOR WITH INTEGRATED THERMAL AND EMI MANAGEMENT

CROSS-REFERENCE TO RELATED APPLICATIONS

This applications is a continuation of U.S. patent application Ser. No. 09/785,892, entitled "METHOD AND APPARATUS FOR PROVIDING POWER TO A MICROPROCESSOR WITH INTEGRATED THERMAL AND EMI MANAGEMENT, by Joseph T. DiBene, II, David H. Hartke, James Hjerpe Kaskade, and Carl E. Hoge, filed Feb. 16, 2001 now U.S. Pat. No. 6,452,113;

which application claims benefit of the following U.S. Provisional Patent Applications which are hereby incorporated by reference herein:

Application Ser. No. 60/183,474, entitled "DIRECT ATTACH POWER/THERMAL WITH INCEP TECHNOLOGY," by Joseph T. DiBene II and David H. Hartke, filed Feb. 18, 2000;

Application Ser. No. 60/186,769, entitled "THERMACEP SPRING BEAM", by Joseph T. DiBene II and David H. Hartke, filed Mar. 3, 2000;

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH CURRENT MICROPROCESSOR POWER DELIVERY SYSTEMS," by Joseph T. DiBene II, filed Jul. 21, 2000;

Application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Ser. No. 60/222,386, entitled "HIGH DENSITY CIRCULAR 'PIN' CONNECTOR FOR HIGH SPEED SIGNAL INTERCONNECT," by David H. Hartke, and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke, and Joseph T. DiBene II, filed Aug. 2, 2000;

Application Ser. No. 60/251,222, entitled "INTEGRATED POWER DELIVERY WITH FLEX CIRCUIT INTERCONNECTION FOR HIGH DENSITY HIGH POWER CIRCUITS FOR INTEGRATED CIRCUITS AND SYSTEMS," BY Joseph T. DiBene II and David Hartke, filed Dec. 4, 2000;

Application Ser. No. 60/251,223, entitled "MICRO-I-PAK FOR POWER DELIVER TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, David Hartke, Carl E. Hoge, James M. Broder, and Joseph S. Riel, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David Hartke, James M. Broder, and Joseph T. DiBene II, filed Feb. 6, 2001;

and which application is a continuation in part of the following co-pending and commonly assigned patent applications, all of which applications are incorporated by reference herein:

application Ser. No. 09/353,428, entitled "INTER-CIRCUIT ENCAPSULATED PACKAGING," by Joseph T. DiBene II and David H. Hartke, filed Jul. 15, 1999, now U.S. Pat. No. 6,304,450, issued Oct. 16, 2001;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now U.S. Pat. No. 6,356,448, issued Mar. 12, 2002; and application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000 now abandoned.

BACKGROUND OF THE INVENTION

1. Field of the Invention

The present invention relates to electronic systems, and in particular to a system and method for providing power to a component such as a processor while providing an integrated approach to managing thermal dissipation and electromagnetic interference.

2. Description of the Related Art

In high-performance desktop or high-end workstation/servers, high-speed microprocessor packaging must be designed to provide increasingly small form-factors. Meeting end user performance requirements with minimal form-factors while increasing reliability and manufacturability presents significant challenges in the areas of power distribution, thermal management, and electromagnetic interference (EMI) containment.

To increase reliability and reduce thermal dissipation requirements, newer generation processors are designed to operate with reduced voltage and higher current. Unfortunately, this creates a number of design problems.

First, the lowered operating voltage of the processor places greater demands on the power regulating circuitry and the conductive paths providing power to the processor. Typically, processors require supply voltage regulation to within 10% of nominal. In order to account for impedance variations in the path from the power supply to the processor itself, this places greater demands on the power regulating circuitry, which must then typically regulate power supply voltages to within 5% of nominal.

Lower operating voltages have also lead engineers away from centralized power supply designs to distributed power supply architectures in which power is bussed where required at high voltages and low current, where it is converted to the low-voltage, high-current power required by the processor by nearby power conditioning circuitry.

While it is possible to place power conditioning circuitry on the processor package itself, this design is difficult to implement because of the unmanageable physical size of the components in the power conditioning circuitry (e.g. capacitors and inductors), and because the addition of such components can have a deleterious effect on processor reliability.

Such designs also place additional demands on the assembly and testing of the processor packages as well.

Further exacerbating the problem are the transient currents that result from varying demands on the processor itself. Processor computing demands vary widely over time, and higher clock speeds and power conservation techniques such as clock gating and sleep mode operation give rise to transient currents in the power supply. Such power fluctuations can require changes in hundreds of amps within a few nanoseconds. The resulting current surge between the processor and the power regulation circuitry can create unacceptable spikes in the power supply voltage $$\left(\text{e.g. } dv = IR + L\frac{di}{dt}\right).$$

FIG. 1 is a plot of a typical transient response 102 at the interface between the voltage regulator and the processor, and comparing that response with nominal 104 and minimum 106 supply voltages. Note that the transient interface voltage includes an initial spike which must not extend below an acceptable margin 108 above the minimum supply voltage, and a more sustained voltage droop 110. In order to retain the supply voltage within acceptable limits 104 and 106 and to reduce variations in supplied power to the processor, the power and ground planes, power and ground vias, and capacitor pads must be designed to ensure low inductance power delivery paths to the processor.

FIG. 2 is a diagram of an exemplary distributed power supply system 200. The power supply system 200 includes a motherboard 202 having a power supply unit 206 such as a DC/DC voltage regulator mounted thereon. The motherboard 202 has a plurality of signal traces, including a first signal trace having a high-voltage/low-current (HV/LC) power signal 204 (which could also be supplied by a wire, for example). The power supply unit 206 accepts the HV/LC power signal and via electrical circuitry including components 208, converts it to a conditioned high-current/low-voltage (HC/LV) signal 210 that is provided to a second signal trace in the motherboard 202.

A socket 214 is electrically coupled to the motherboard 202 via a first electrical connection 212, such as a ball grid array (BGA). The socket 214 includes internal electrical connections for providing the HC/LV signal to pins 216 electrically coupled between the socket 214 and a power regulation module 218. Similarly, the power regulation module 218 is electrically coupled to a substrate 222 via a second electrical coupling 220 such as a BGA. The processor (e.g. the die) 226 is electrically coupled to the substrate 222 via a third electrical coupling 224. The HC/LV signal is provided to the processor via the circuit path described above. As described earlier distributed power systems such as is illustrated in FIG. 1 still result in unacceptable impedances that cause voltage drops in the power distribution path.

In order to obtain the proper margin as shown in FIG. 1, surge currents are managed by placing decoupling capacitors 228 and other components throughout the power delivery subsystem, including on the power regulation module 218, on the motherboard, on the processor die package, and on the die itself. This not only increases costs, but consumer critical silicon area, chip package and board real estate. Further, for microprocessors operating at more than 200 MHz, the only serviceable capacitor is an on-die capacitor, or one that is very close to the die. On-die capacitors are common in PC-class processors.

The need for higher performance and increased functional integration in smaller processor dies has also lead to higher heat-flux concentrations in certain areas of the processor die. In some cases, the resulting surface energy densities approach unmanageable levels. Processor reliability is exponentially dependent on the operating temperature of the die junction. Lowering temperatures in the order of 10-15 degrees centigrade can double the processor lifespan. Thermal management issues now present some of the largest obstacles to further processor miniaturization and increases in processor speed.

Thermal management must also take nearby voltage regulator efficiencies into account. An 85% efficient voltage regulator driving a 130 watt device dissipates over 20 watts. This makes it more difficult to locate the voltage regulator close to the CPU because the thermal management structures for each component conflict. Electromagnetic interference (EMI) is also a problem. In a typical computer system, the processor 226 is by far the largest source of electromagnetic energy. Containing radiated and conducted emissions at the source (at the processor package) would make the system design easier for computer OEMs. Because of the generation of higher order harmonics, Federal Communications Commission (FCC) regulations require emission testing at frequencies up to five times the processor clock frequency or 40 GHz, whichever is lower.

The primary component of EMI is a radiated electromagnetic wave which gets smaller as frequencies increase. EMI management, which generally is performed on the chassis level rather than the component level, is typically accomplished by reducing the size of openings in the system, effectively blocking the electromagnetic waves. However, using smaller apertures introduces thermal management problems because of decreased airflow.

Another method for reducing EMI is to ground any heat sinks. Noise coupled from the processor package to the heat sink may cause the heat sink to act as an antenna and re-radiate the noise. However, it is typically not possible to ground the heatsink through the processor package. Also, while the grounding of the heatsink may reduce EMI, this technique is typically insufficient to meet EMI requirements, and additional shielding is typically necessary.

What is needed is an integrated processor packaging technology that provides the required form factor while providing high current low voltage to the processor without requiring bulky external capacitors to account of path inductances, and while managing thermal and EMI emissions within satisfactory levels. The present invention satisfies that need.

SUMMARY OF THE INVENTION

To address the requirements described above, the present invention discloses a modular circuit board assembly and a method for making same.

The modular circuit board assembly comprises a substrate, having a component mounted thereon, a circuit board, including a circuit for supplying power to the component, and at least one conductive interconnect device disposed between the substrate and the circuit board, the conductive interconnect device configured to electrically couple the circuit to the component.

In one embodiment of the present invention particularly suitable for use with interposer board constructions, the circuit board includes a voltage regulation module (VRM) and a plurality of non-compressible conductive standoffs are used to mount the circuit board to the processor substrate.

This embodiment provides a modular package in which the mechanical standoffs serve many purposes. First, they provide a low inductance path directly to the processor, rather than the higher inductance path through the substrate, socket and other elements depicted in FIG. 2. Second, they provide the proper z-axis (typically vertical) physical relationship between the substrate and the circuit board. The modular assembly can be plugged into a socket on the motherboard, and all of the pins on the socket can be used as signal pins instead of power pins. This also allows the processor to be easily separated from the motherboard, even while providing power, if desired.

This embodiment also provides the advantage of permitting a robust, consistent thermal and mechanical interface to a heatsink or other thermal dissipation device. Compressible or other compliant interfaces can be used to manage the physical and thermal connection between the circuit board, VRM components and other components on the circuit board, as well as the processor. These interfaces can provide a compression thermal coupling for the thermal interface of the microprocessor that can be adapted to a wide range of operating requirements.

In a second embodiment particularly suited for use with organic land grid array (OLGA) based constructions which may or may not not use interposer boards, the conductive interconnect device comprises concentric conductive spring devices disposed about the periphery of the component. Since this embodiment does not require the use of an interposer board, it is more compact, and easier and less expensive to manufacture. This embodiment also permits the top surfaces of the VRM circuit board and the processor to be substantially co-planar, allowing a better surface for physical and thermal mating with the heat sink. The spring action provided by the conductive interconnect device provides a low-inductance electrical connection and a flexible mechanical spring force to control the thermal and mechanical interface between the heat sink, the processor, and the VRM board. Another advantage of this embodiment is that screws are not required to make the electromechanical connection between the VRM board and the substrate. Instead, mechanical connection can be accomplished by spring fingers and similar simple devices. Further, the spring fingers can be applied as the last step in assembly.

The present invention includes an architecture that differs from conventional microprocessor packaging architectures in that it addresses all the significant off-chip requirements that affect the performance and reliability of the microprocessor using symbiotic relationships between architecture elements. The architecture uses a low cost, coaxial interconnection and physically integrates the high current delivery capability of the coaxial connection with custom designed power regulators to provide self-contained and physically separable power delivery modules that can be connected to interposer boards, OLGAs, CLGAs or other area array packages.

Microprocessor and power regulator thermal dissipation requirements are both satisfied by using an integrated heatsink that provides a thermal power dissipation path for both sources of heat.

In one embodiment, the integrated architecture also includes an electrically conductive frame and associated fittings and hardware that electrically couples with the heatsink and encases the microprocessor, power delivery module and other circuits to minimize and contain EMI within the package rather than within the chassis.

When compared with conventional methods of power delivery, thermal power dissipation, and EMI reduction the present invention boosts the volumetric form factor efficiency of the microprocessor. At the same time, signal integrity/performance, manufacturability, reliability and cost effectiveness are also improved. The architecture is suitable for the generation of three dimensional solutions for microprocessor and electronic circuits configurations that are pre-packaged on, or pre-connected to, interposer boards, OLGAs using BUM technology, CLGAs, Flip-Chip Pin Grid Arrays (FC-PGAs), Flip Chip Ball Grid Arrays (FC-BGAs), as well as other electronic circuits substrates and bare chips.

The architecture provides packaging solutions that include custom designed modules, interconnections and component hardware that are physically separable but can also be interconnected and combined to form connectable modules or packages that permits direct attachment of lidded or unlidded substrates bonded to microprocessors or other electronic circuits including, but not limited to, multi-chip modules. This architecture is extendable to direct chip attach of microprocessors or microcircuits into custom designed and integrated cavity package formats that can also be configured to function as test sockets.

BRIEF DESCRIPTION OF THE DRAWINGS

Referring now to the drawings in which like reference numbers represent corresponding parts throughout:

FIG. 6A is a diagram showing one embodiment the power regulation module of one embodiment of the present invention;

FIG. 6B is a diagram showing an assembly following connection of conductive standoffs to a circuit board through plated-through holes;

DETAILED DESCRIPTION OF THE PREFERRED EMBODIMENT

In the following description, reference is made to the accompanying drawings which form a part hereof, and in which is shown, by way of illustration, several embodiments of the present invention. It is understood that other embodiments may be utilized and structural changes may be made without departing from the scope of the present invention.

i-PAK Architecture

Figure 1:
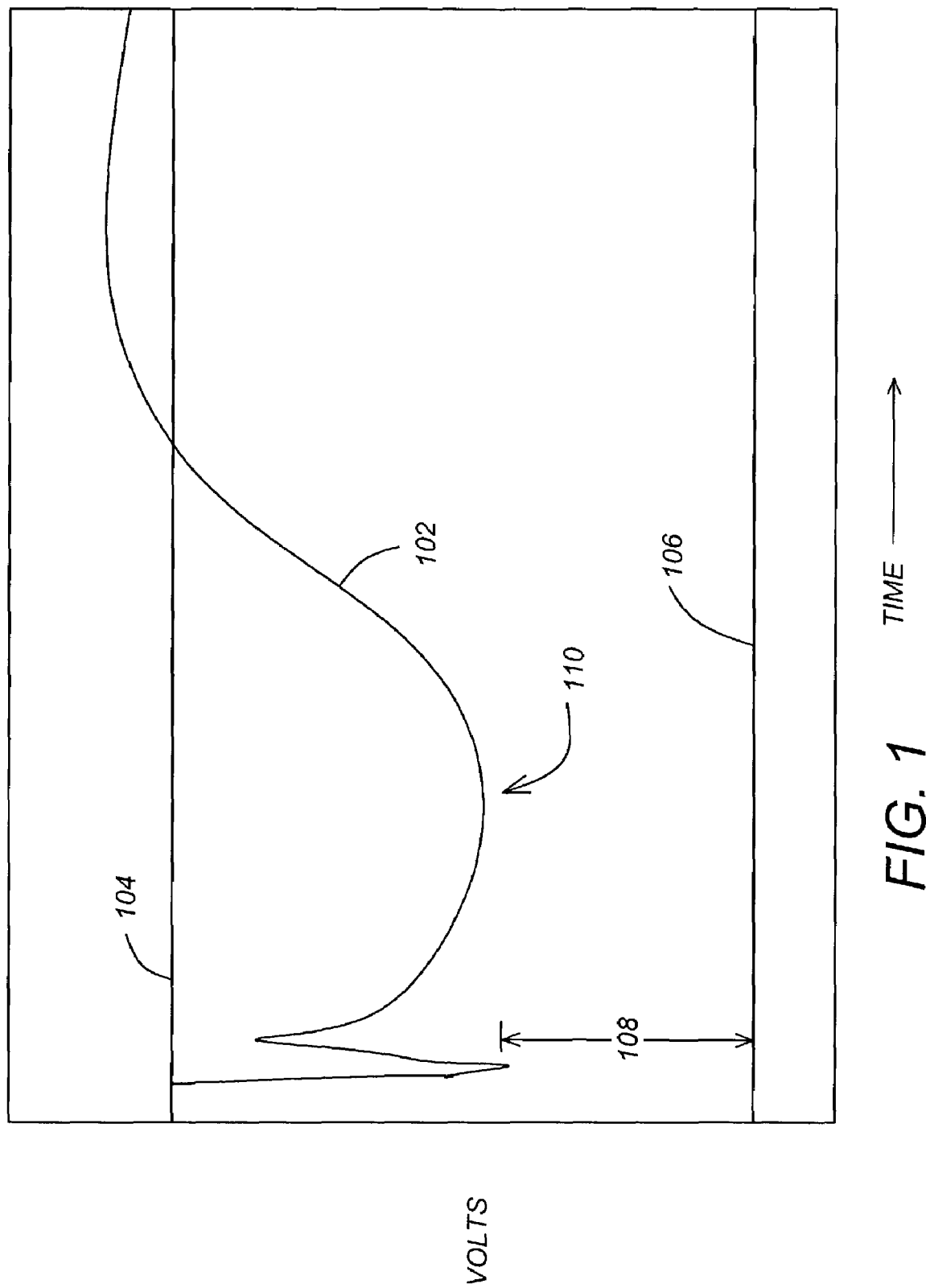
FIG. 1 is a plot of a typical transient response at an interface between a voltage regulator and a processor.
Figure 2:
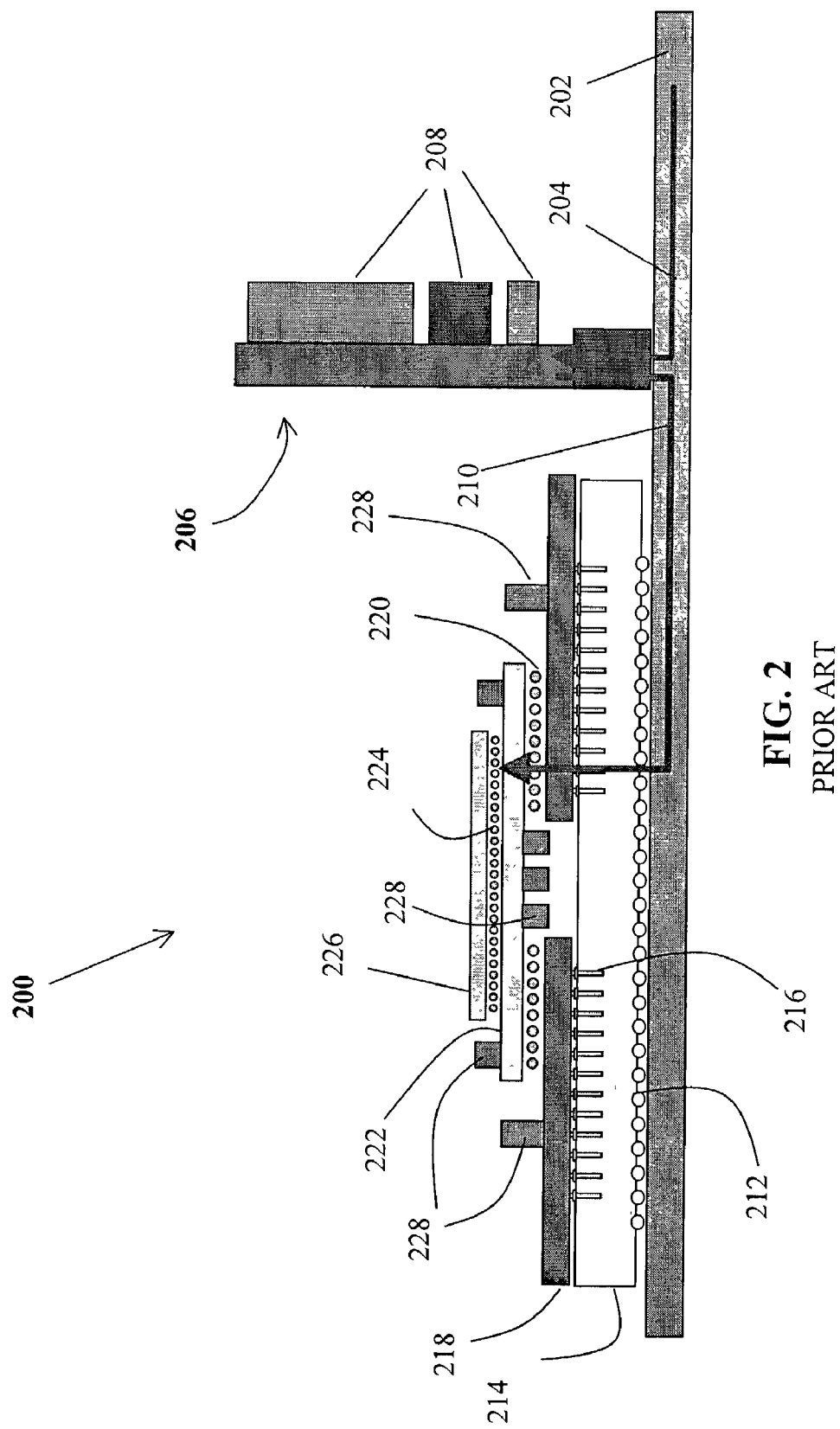
FIG. 2 is a diagram of an exemplary distributed power supply system.
Figure 3:
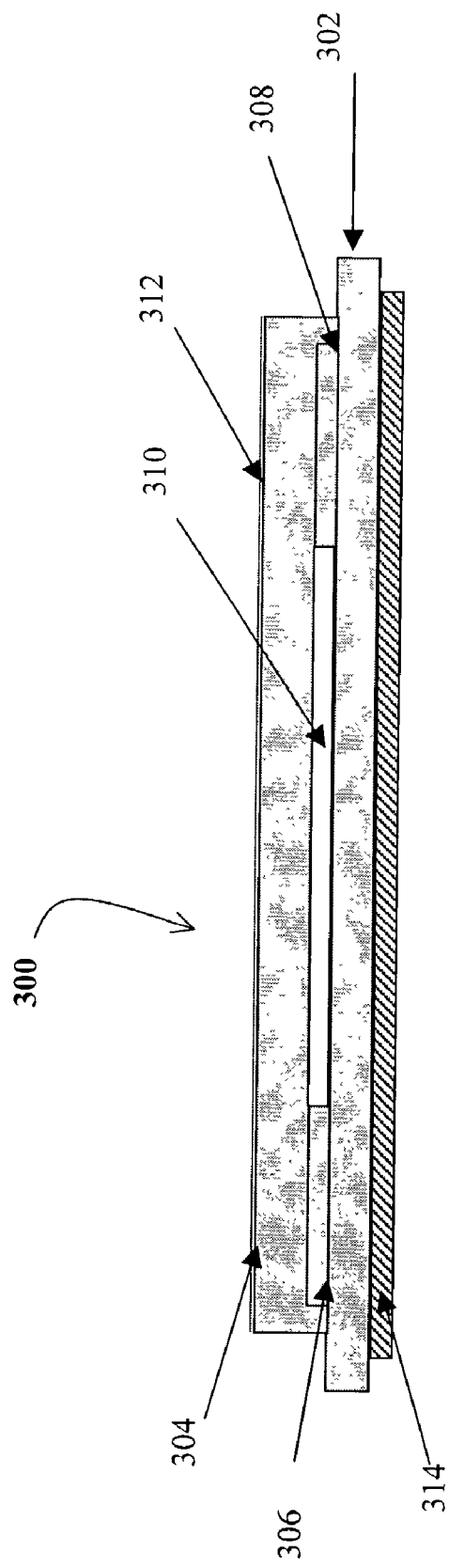
FIG. 3 is a diagram of a typical microprocessor or electronic circuit package.

FIG. 3 is a diagram illustrating a typical microprocessor or electronic circuit package 300. A lid 304 which is usually composed of copper or other high thermal conductivity material is bonded to a substrate 302 using adhesive or metallurgical connection at junction 306. Also bonded to the substrate 302 is a microprocessor or electronic circuit 310. The connection between the substrate and the processor 310 can be made using solder balls (bumps) known as "flip-chip" or C-4 (controlled collapse chip connection). The physical gap between the substrate 302 and the processor 310 is occupied by a polymeric composite called an underfill. The underfill adds mechanical strength to the joint formed between the substrate 302 and the processor 310 and functions to encapsulate the processor 310 in a manner analogous to a liquid encapsulant or a mold compound. The space between the back surface of the processor and the underside of the lid 304 is occupied by a thermal grease known as Thermal Interface Material-1, (TIM-1). TIM-1 provides a thermal power dissipation path from the back surface of the processor 310 to the inner surface of the lid 304. The outer surface of the lid 304 is coated with a thermal grease 312 known as TIM-2. The underside of the substrate 302 contains an array of metal pads 314 that are electrically connected to the solder balls of the processor 310. The substrate 302 can be a Built-up Multilayer (BUM), an Organic Land Grid Array (OLGA) or an inorganic substrate known as a Ceramic Land Grid Array (CLGA). The substrate provides electrical connections to the microprocessor.

Figure 4:
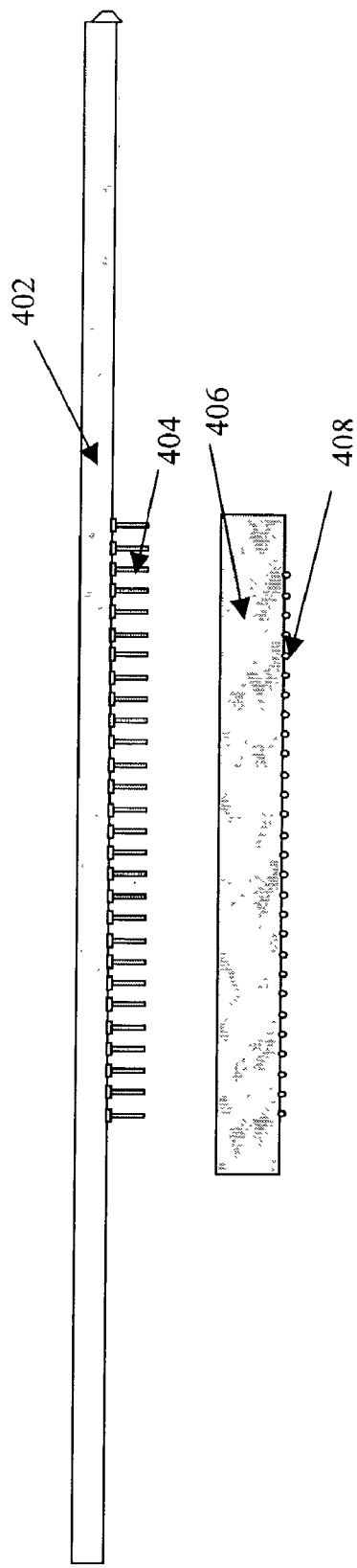
FIG. 4 is a diagram of a circuit board.

FIG. 4 is a diagram illustrating a circuit board 402 with an array of metal pins 404 on the underside. The pins 404 are connected to the top surface of the circuit board through internal vias. A surface mount socket 406 accommodates and makes electrical connection between the pins 404 and an array of solder balls 408.

Figure 5:
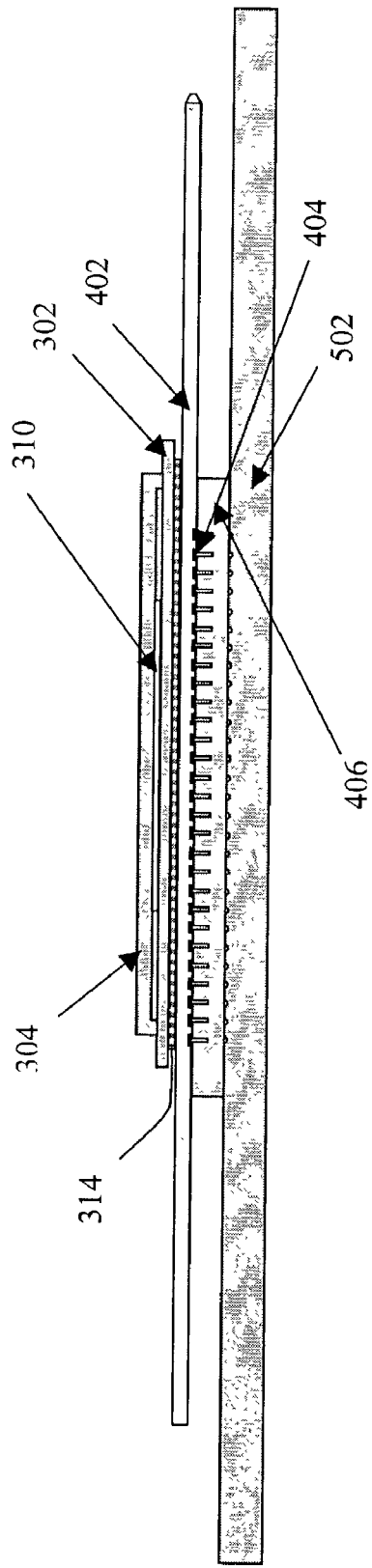
FIG. 5 is a diagram showing the combined elements of FIG. 3 and FIG. 4.

FIG. 5 shows the elements depicted in FIGS. 3 and 4 connected and stacked together, and placed on a motherboard 502.

As described earlier, microprocessors typically obtain power from power conditioning modules (e.g. power regulators and/or DC/DC converters) which are disposed at a distance from the microprocessor though circuit paths in the motherboard 502. Power delivery proceeds from the power regulator through the motherboard 502 into the surface mount socket 406, through pins 404 to the circuit board 402 through metal pads 314, the substrate 302 and finally through the C-4 connection to the electronic circuit 310. This route provides a lengthy path through several connections that can impair signal integrity and produce high electrical impedance. Also, hundreds of power delivery connections (pins) may be need to provide high current to the microprocessor or electronic circuits 310. This design places constraints on the multi-layer substrate 302, because power must be brought through many different layers before reaching the processor circuit 310 itself.

FIG. 6A is a diagram showing one embodiment of the power regulation module 600 of the present invention. The power regulator module 600 comprises a circuit board 602. The circuit board 602 includes a power conditioning, regulation, or supplying circuit that is configured to supply power to a power dissipating element such as a processor (not shown in FIG. 6). The circuit board 602 can include components such as components 608A and 608B (collectively referred to hereinafter as component(s) 608) that can be part of the power conditioning circuit, or may be for the purpose of performing other functions. Thermal vias 606 are arranged within the circuit board 602 to provide an electrical path from a first or under surface 614A of circuit board 602 to a second or upper surface 614B of the circuit board 602. Thermal vias 606 can thus provide an electrical path for the components(s) 608 from the lower surface of the circuit board 614A to the upper side 614B of the circuit board 602, from layer to layer within the circuit board 602. Thermal vias 606 can also provide thermal coupling 608 to transfer heat from the first surface of the circuit board 614A to the second surface of the circuit board 614B.

In one embodiment, the circuit board 602 also includes an aperture 604, through which the processor is disposed upon assembly. The circuit board 602 also includes one or more plated-through holes 610 (e.g. copper-plated). In one embodiment, the plated through holes 610 are disposed proximate to and symmetrically about the aperture 604. One or more circuit board conductive surfaces (e.g. pads) 616A and 616B can be configured on the surface of the circuit board 602 around the plated through holes 610. Further, one or more conductive interconnect devices 612A and 612C can be arranged physically contact the conductive pads 616A and 616B, thus providing an electrical path away from the circuit board 602.

In one embodiment, the circuit board conductive surfaces 616 comprise a circuit board first conductive surface 616A and a circuit board second conductive surface 616B, and the conductive interconnect devices 612 include a first portion 612A and a second portion 612B separated by a dielectric portion 612C. When the conductive interconnect 612 is coupled to the circuit board 602, first portion 612A is electrically coupled to circuit board first conductive surface 616A and the second portion 612B is electrically coupled to the circuit board second conductive surface 616B. In one embodiment, the conductive interconnect device is a conductive standoff or a spacer.

The conductive interconnect device 612 provides serves dual purposes. First, it provides mechanical coupling between the circuit board 602 and the substrate 302, providing sufficient separation between the circuit board 602 and the substrate 302. The conductive interconnect device 612 may also be configured not only to separate the circuit board 602 and the substrate 302, but with suitable attachment devices, to keep the circuit board 602 and the substrate 302 together. The other function provided by the conductive interconnect device 612 is to provide one or more conductive paths from the circuit board 602 to the substrate 302. Typically, two conductive paths are provided, including a first conductive path for a power signal and a second conductive path for a ground.

The disclosed coaxial arrangement of the first portion of the conductive standoff 612A and the second portion of the conductive standoff 612B permits a very low inductance electrical connection between the circuit board 602 and the substrate 302. If desired, a plurality of two piece coaxial conductive interconnects can be used (e.g. at each corner of the processor 310). Additional embodiments of the conductive interconnect devices 612 will be described below.

FIG. 6B is a diagram showing the assembly following connection of the conductive standoffs 612 to the circuit board 602 through the plated-through holes 610.

Figure 7:
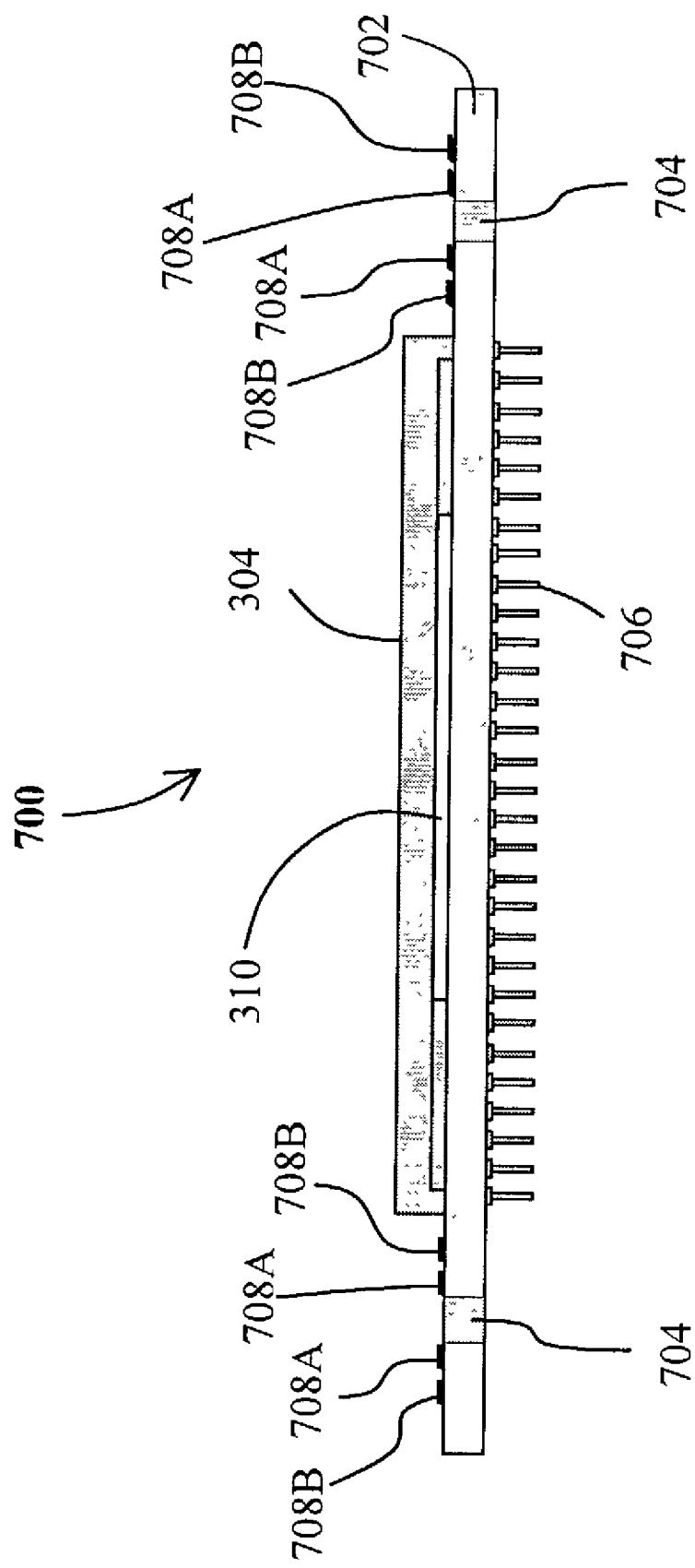
FIG. 7 is diagram showing a substrate assembly.

FIG. 7 is a diagram showing a substrate assembly 700 of the present invention. The substrate assembly 700 is similar to the substrate assembly discussed with reference to FIGS. 3-5, but with important differences that are described herein. This substrate assembly 700 is part of an integrated architecture alternatively referred to hereinafter as the i-PAK architecture. In this embodiment, the area of the substrate is enlarged relative to the size of substrate 302 in FIG. 5, to accommodate plated through-holes 704 and an array of pins 706.

A first (top) surface of the substrate 702 includes a first conductive surface 708A and a second conductive surface 708B similar to the conductive surfaces 616 disposed on the bottom surface 614A of the circuit board 602. Internal power and ground planes in the built up layers of the substrate 702 connect to the pads for solder bump (C-4) connections of the microprocessor 310. Because power is supplied directly to the conductive surfaces 708A on the substrate 702 and thence to different components within the substrate 702, many power pin connections required in the configuration shown in FIGS. 3-5 can be eliminated. Some of the substrate 702 real estate may be lost, however, due to the area dedicated to the plated through holes 704.

Figure 8:
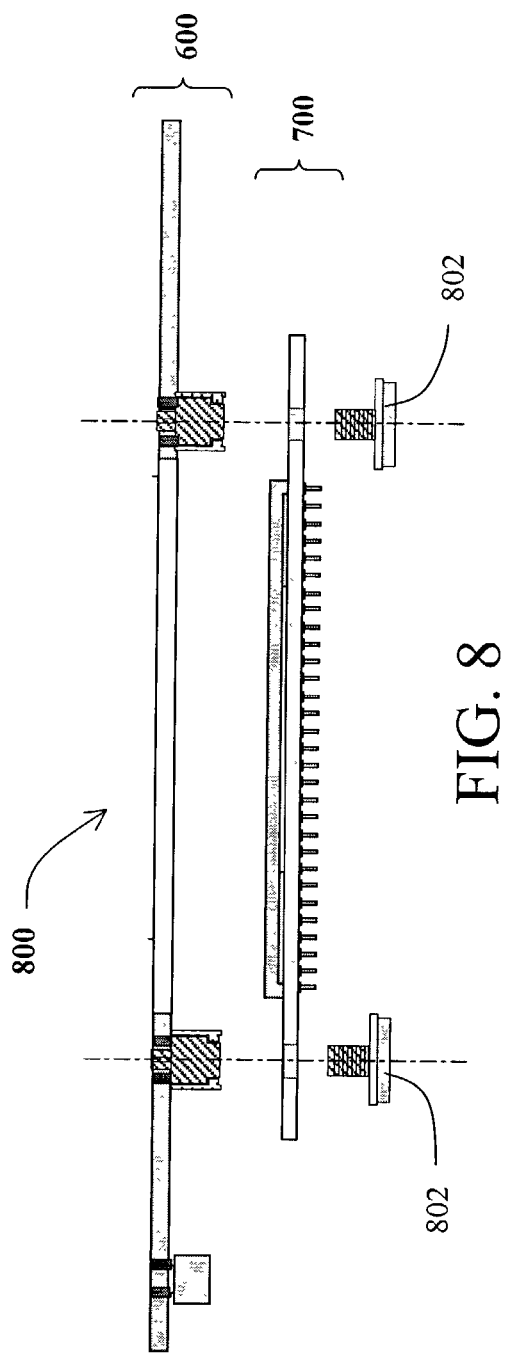
FIG. 8 is a diagram a modular circuit board assembly.

FIG. 8 is a diagram showing the modular circuit board assembly 800, including the substrate assembly 700 and the power regulation/delivery module 600. Fasteners 802 mechanically and electrically connect to the modular circuit board assembly 800 to the substrate assembly 700.

Figure 9:
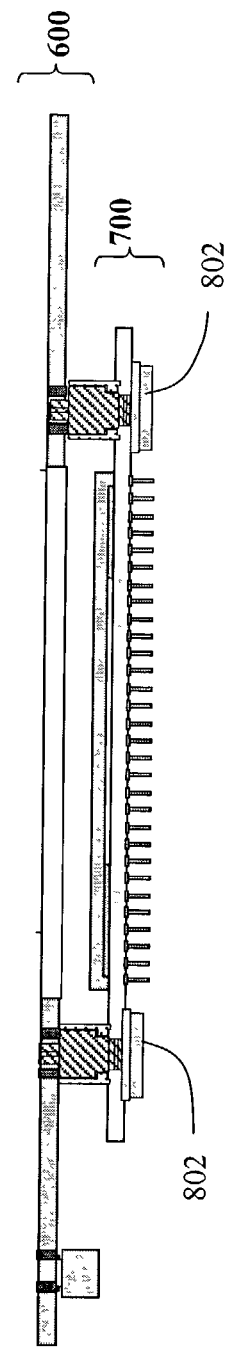
FIG. 9 is a diagram showing an assembled modular circuit board assembly.

FIG. 9 shows the assembled modular circuit board assembly 800.

Figure 10:
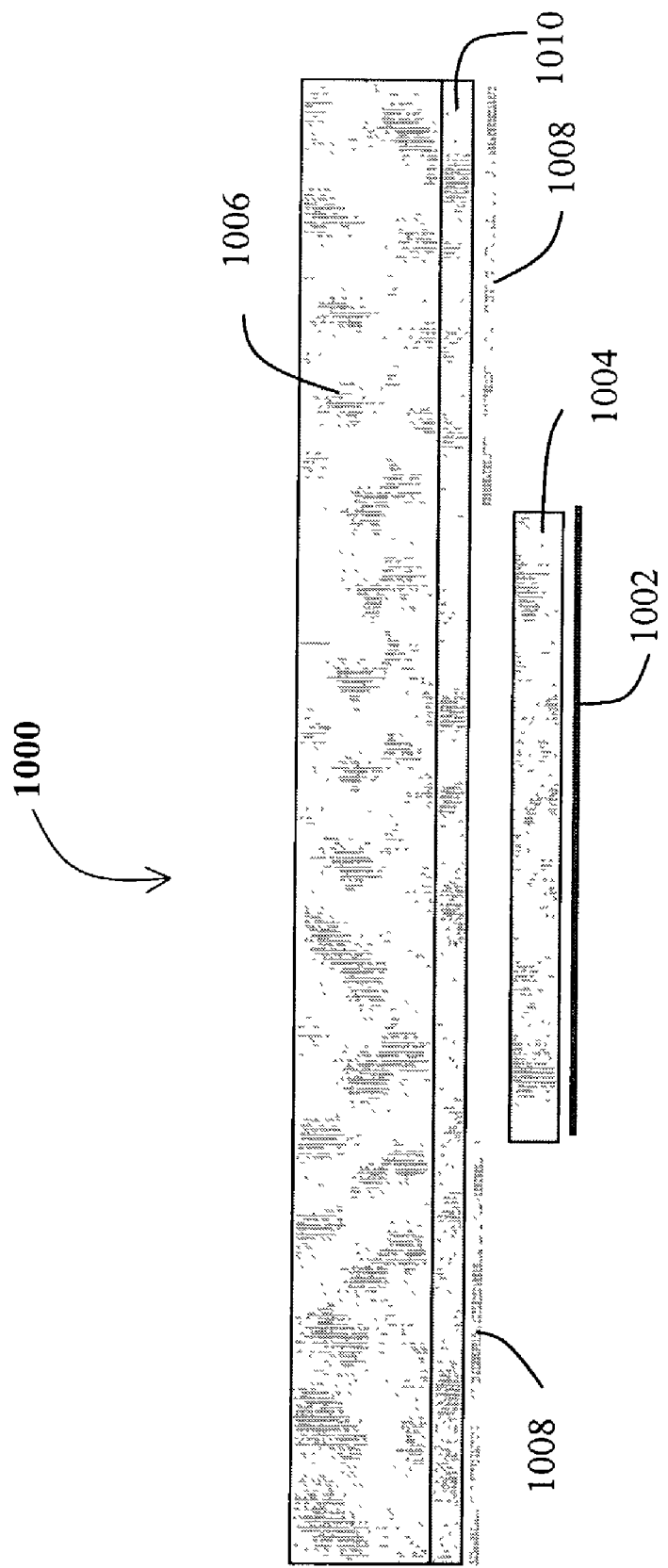
FIG. 10 is a diagram showing an integrated heatsink system.

FIG. 10 is a diagram showing an integrated heatsink system 1000 for the integrated architecture for the i-PAK modular circuit board assembly 800. The heat sink system 1000 includes a thermally conductive and compressibly compliant interface material 1002 such as a TIM-2 thermal grease, a high thermal conductivity spacer plate 1004 that precisely fits into the cutout in 604, a large planar heatsink 1006 and a further thermally conductive and compressibly compliant interface material 1008 such as thermal grease. The spacer plate 1004 can be physically connected to the heatsink 1006 or can be thermally connected to 1006 using a plate 1010.

Figure 11A:
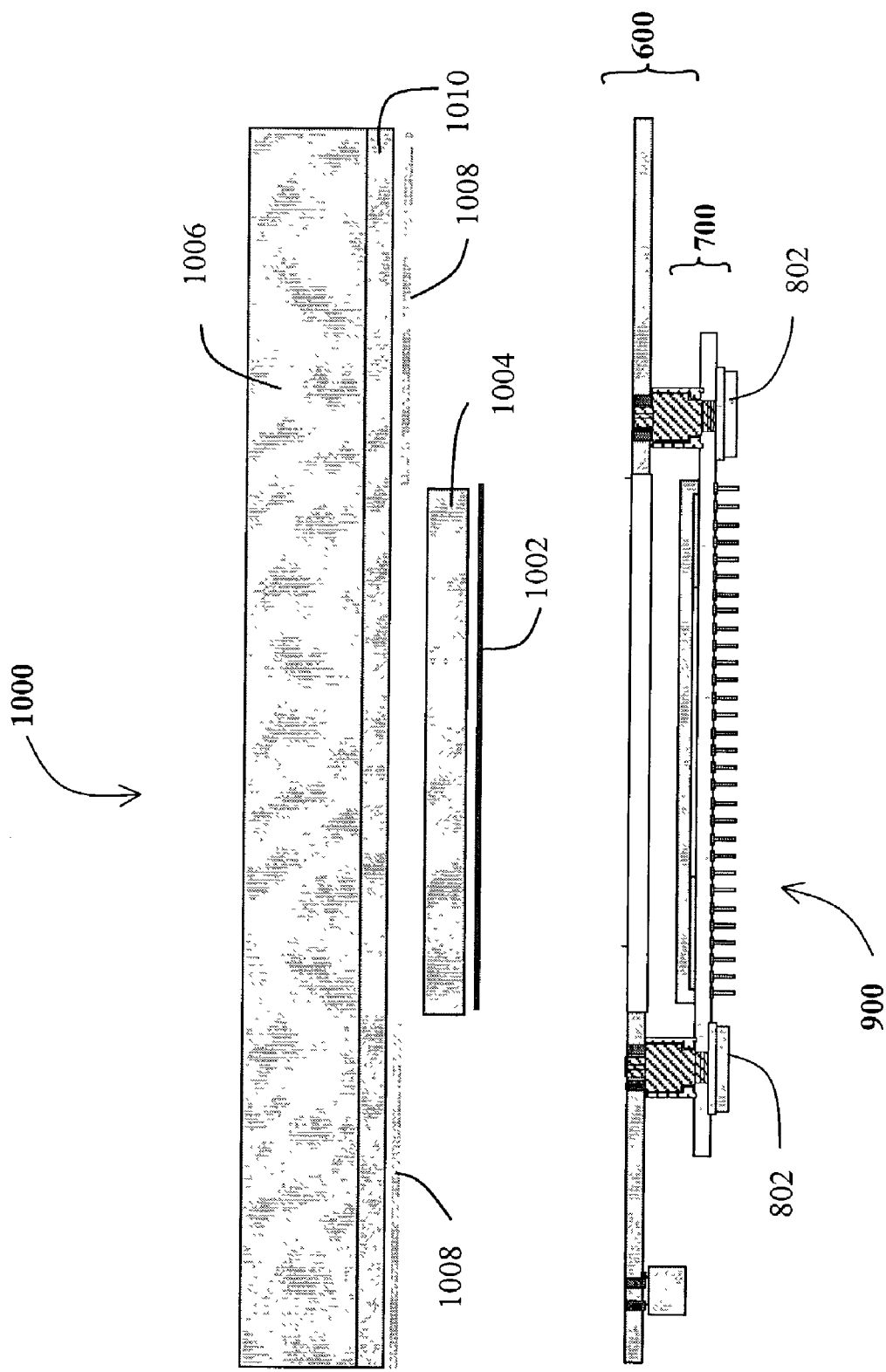
FIG. 11A is a diagram showing the integrated heatsink system positioned above the modular circuit board assembly.

FIG. 11A is a diagram showing the integrated heatsink system 1000 positioned above the modular circuit board assembly 800.

Figure 11B:
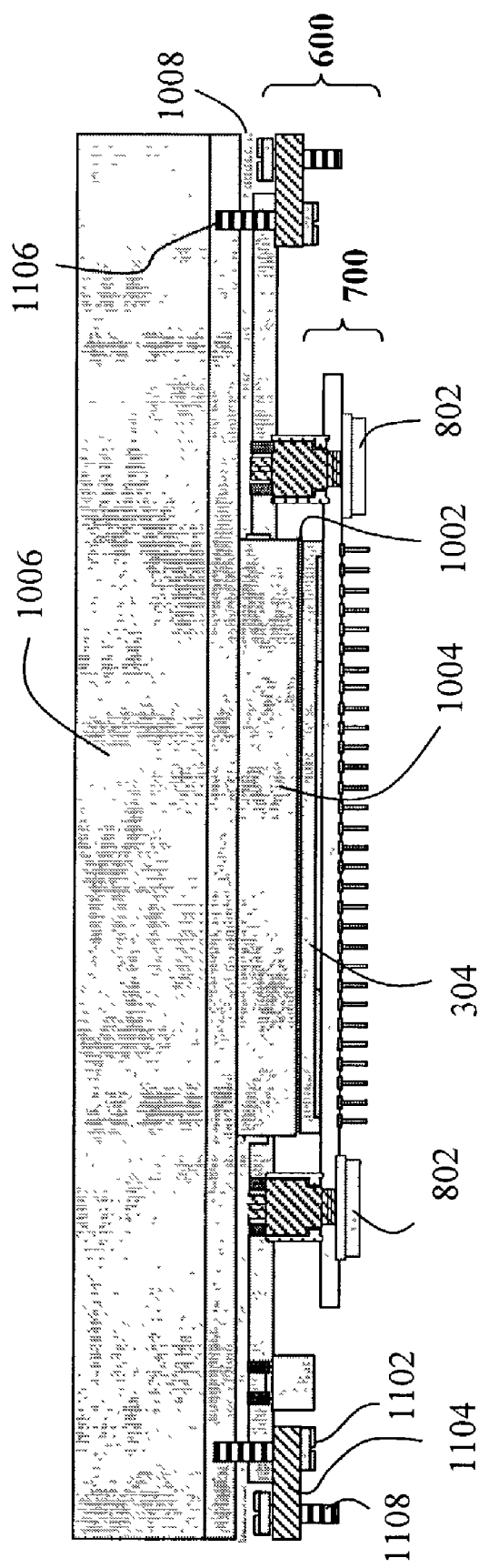
FIG. 11B is a diagram showing the integrated heatsink system interconnected with the modular circuit board assembly.

FIG. 11B is a diagram showing the integrated heatsink system 1000 after connecting the connection of the heatsink system 1000 with the modular circuit board assembly 800. This integrated i-PAK architecture physically connects a thermal power dissipation path from the top of the microprocessor lid 304, through TIM-2 1002, through the spacer plate 1004 to the bottom surface of the heatsink 1006. Also connected to the heat sink 1006 is the surface of the power regulation module 600 through thermal grease 1008 or other suitable interface. Note that in this embodiment, the bottom surface of the heatsink 1006 can be substantially planar and still contact both the top surface of the circuit board 602 and the top surface of the spacer plate 1104 (or if no spacer plate is required, the top surface of the lid 304).

FIG. 11B also illustrates how the modular circuit board assembly 800 may be coupled to the integrated heat sink system 1000. The heat sink 1006 or plate 1010 may include an indentation 1106 in which a fastening device 1102 is inserted and secured. The fastening device 1102 couples to an extension member 1104. The extension member couples to a second fastening device 1108.

Figure 12:
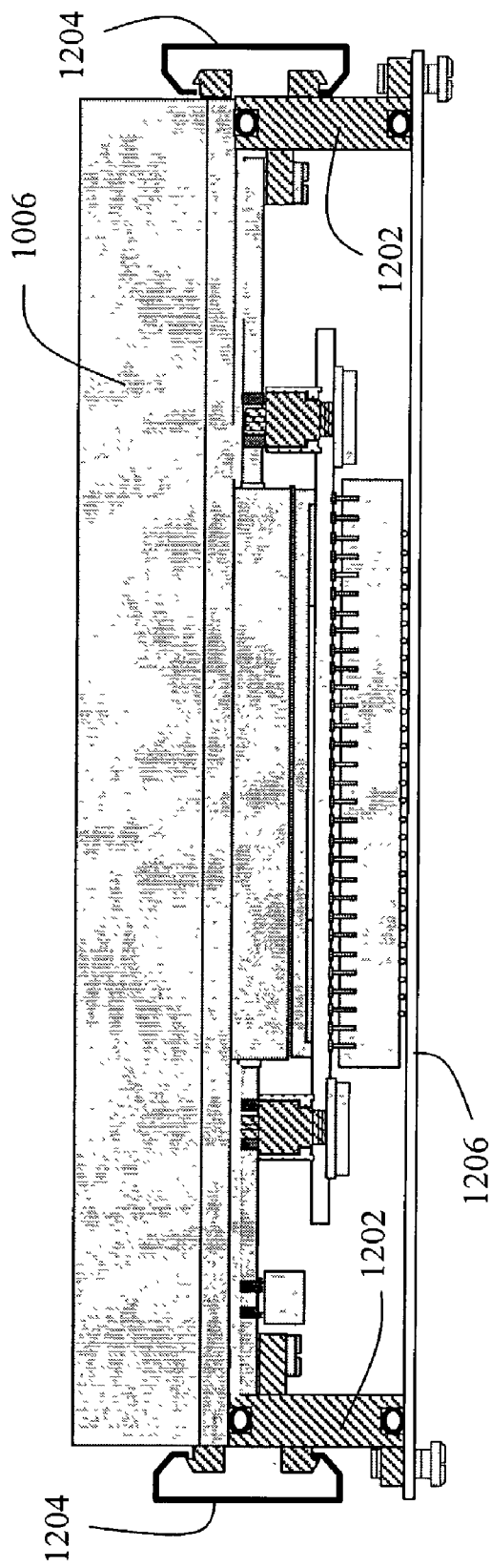
FIG. 12 is a diagram showing the integrated i-PAK structure with an electrically conductive frame to minimize EMI.

FIG. 12 is a diagram showing the incorporation of an electrically conductive frame 1202 that substantially surrounds the periphery of the processor 310, and is physically connected to the integrated heatsink 1006. This frame 1202, when connected to the heatsink 1006 and subsequently connected to a stiffener board 1206 or motherboard and held together by fastener springs 1204, forms a three dimensional enclosure that captures electromagnetic radiation generated by the microprocessor, power regulator and associated circuitry at the package level instead of at the chassis level. The frame 1202 is also electrically coupled to the integrated heatsink 1000. This combination (e.g. the integrated i-PAK architecture) simultaneously solves many problems described earlier in this disclosure, including the need to provide high-current, low-voltage power, dissipate heat, contain EMI at the package level, increase reliability, all within form factor and cost constraints. Also illustrated is a socket 1208, into which electrically connects the motherboard to the pins and hence to the processor 310.

Micro i-PAK Architecture

The present invention can be practiced in another embodiment that achieves many of the advantages of the i-PAK architecture, but in a smaller package.

Figure 13:
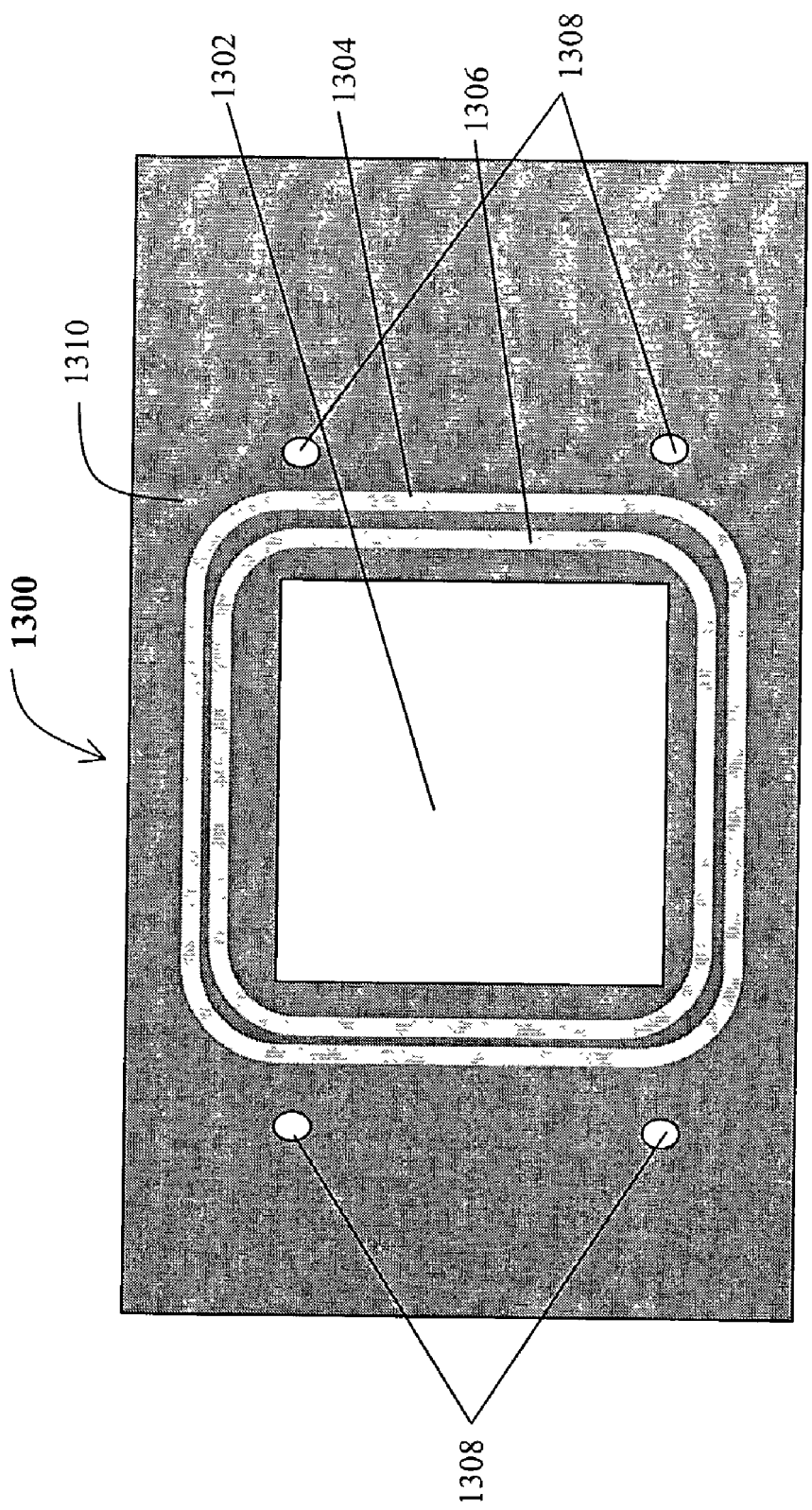
FIG. 13 is a diagram presenting a view of a second embodiment of the power delivery module.

FIG. 13 is a diagram presenting a view of the bottom surface 614A of another embodiment of the power delivery module 1300. The power delivery module 1300 includes a power delivery module circuit board 1310. A portion (preferably the center) of the power delivery module circuit board 1310 includes an aperture 1302 and conductive surfaces 1306 and 1304. In the illustrated embodiment, the conductive surfaces are concentric metal rings. Conductive surfaces 1306 and 1304 connect to power and ground in the regulator and delivery module 1300. As will be seen, conductive surfaces 1306 and 1304 function much like the circuit board first conductive surface 616A and the circuit board second conductive surface 616B, respectively, in that they provide a path for providing power and ground, respectively, to the processor 310.

A number of through holes 1308 may be positioned near conductive surfaces 1306 and 1304 for coupling the power delivery module 1300 to elements of the architecture. In other embodiments, such connection can be made with the use of clamps, clips, or other device(s), and no through holes 1308 are required.

Figure 14:
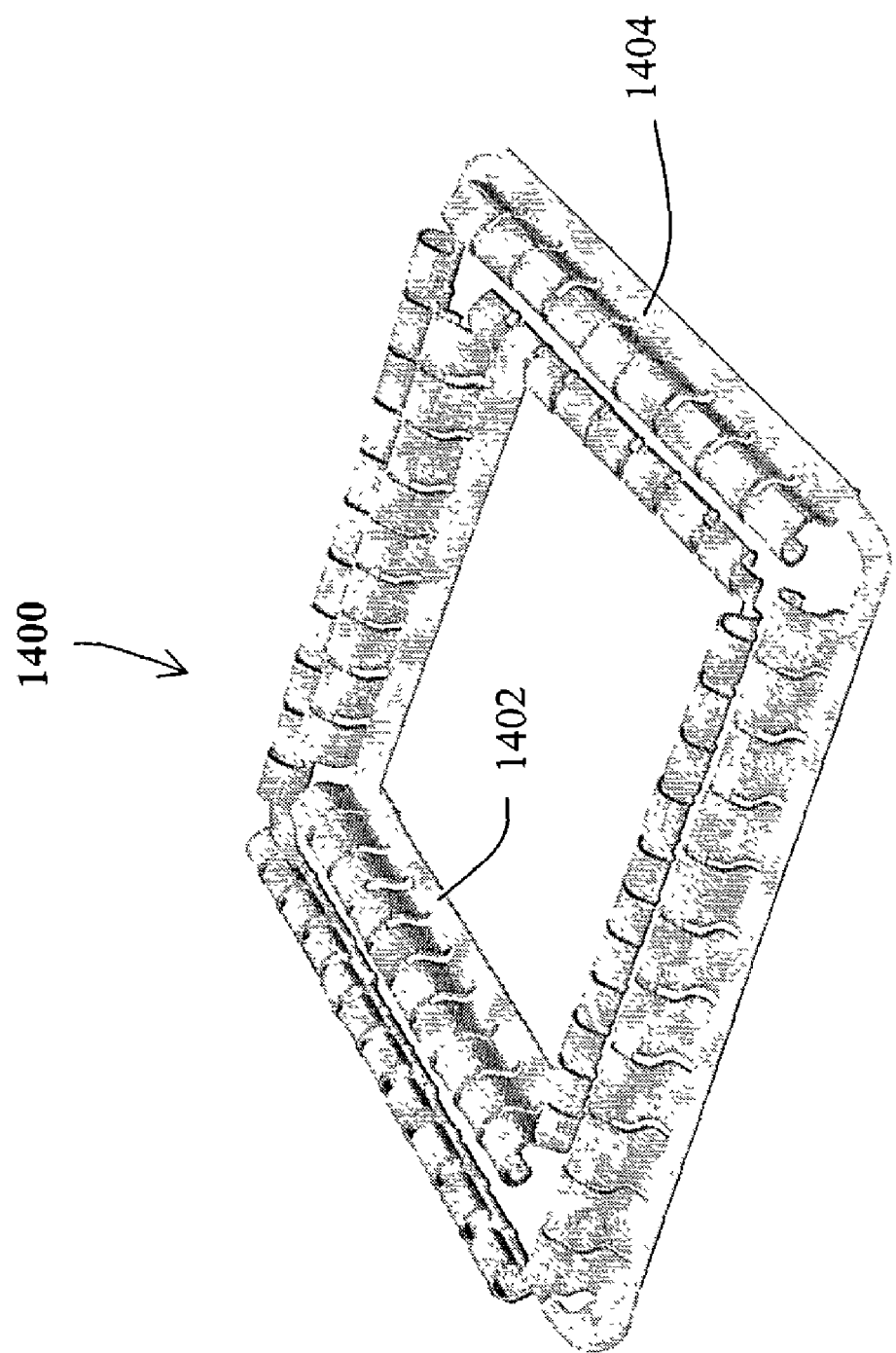
FIG. 14 is a diagram presenting a perspective view of the conductive interconnect device.

FIG. 14 is a diagram presenting a perspective view of a second embodiment of the conductive interconnect device 1400. This second embodiment of the conductive interconnect device is described by two characteristics. First, unlike the previously described embodiment, this embodiment of the conductive interconnect device surrounds the component. Second, unlike the previously described embodiment, this embodiment of the conductive interconnect device establishes electrical connection between the power delivery module 1300 and it's associated circuits and the substrate by use of compressibility in the z (vertical) axis.

In one embodiment, the conductive standoff device 1400 includes a first conductive standoff portion 1402 and a second conductive standoff portion 1404. In the illustrated embodiment, the first 1402 and second conductive standoff 1404 portions are arranged concentrically. In the illustrated embodiment, the conductive interconnect device 1400 includes a plurality of compressible conductive springs (e.g. microsprings). The plurality of compressible conductive springs may include a first (inner) plurality of compressible conductive springs 1402 and a second (outer) plurality of compressible conductive springs 1404.

The first conductive standoff portion 1402 and the second conductive standoff portion 1404 are aligned with and can be electrically connected to the power delivery module circuit board 602 conductive surfaces 1306 and 1304, respectively. This can be accomplished by a number of methods, including conventional soldering, reflow soldering, bonding, friction techniques.

The embodiment illustrated in FIG. 14 illustrates but one embodiment of the conductive interconnect device. Other conductive interconnect device embodiments are also possible and are within the scope of the present invention, particularly those which include either contact achieved through compressibility along the z-axis or which substantially surround the component.

Figure 15:
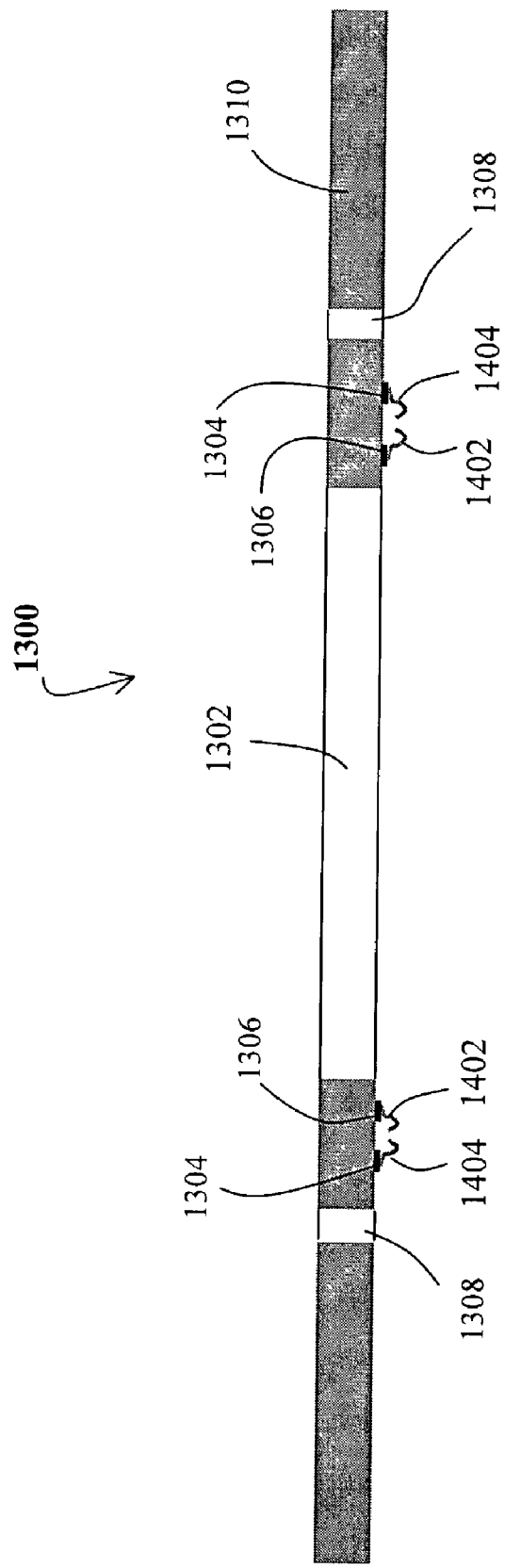
FIG. 15 is a diagram showing an edge view of the power regulator and delivery module following attachment of a conductive interconnect device.

FIG. 15 is a drawing showing an edge view of the power regulator and delivery module 602 following attachment of the inner plurality of compressible springs 1402 and the outer plurality of compressible springs 1404 to the bottom surface of the power delivery module 602 at conductive surfaces 1304 and 1306. Also shown are two of the through-holes 1308 in the power delivery module. These through-holes 1308 are used for screw-type connections but are not needed for other connections including, but not limited to, clips, clamps or fasteners.

Figure 16:
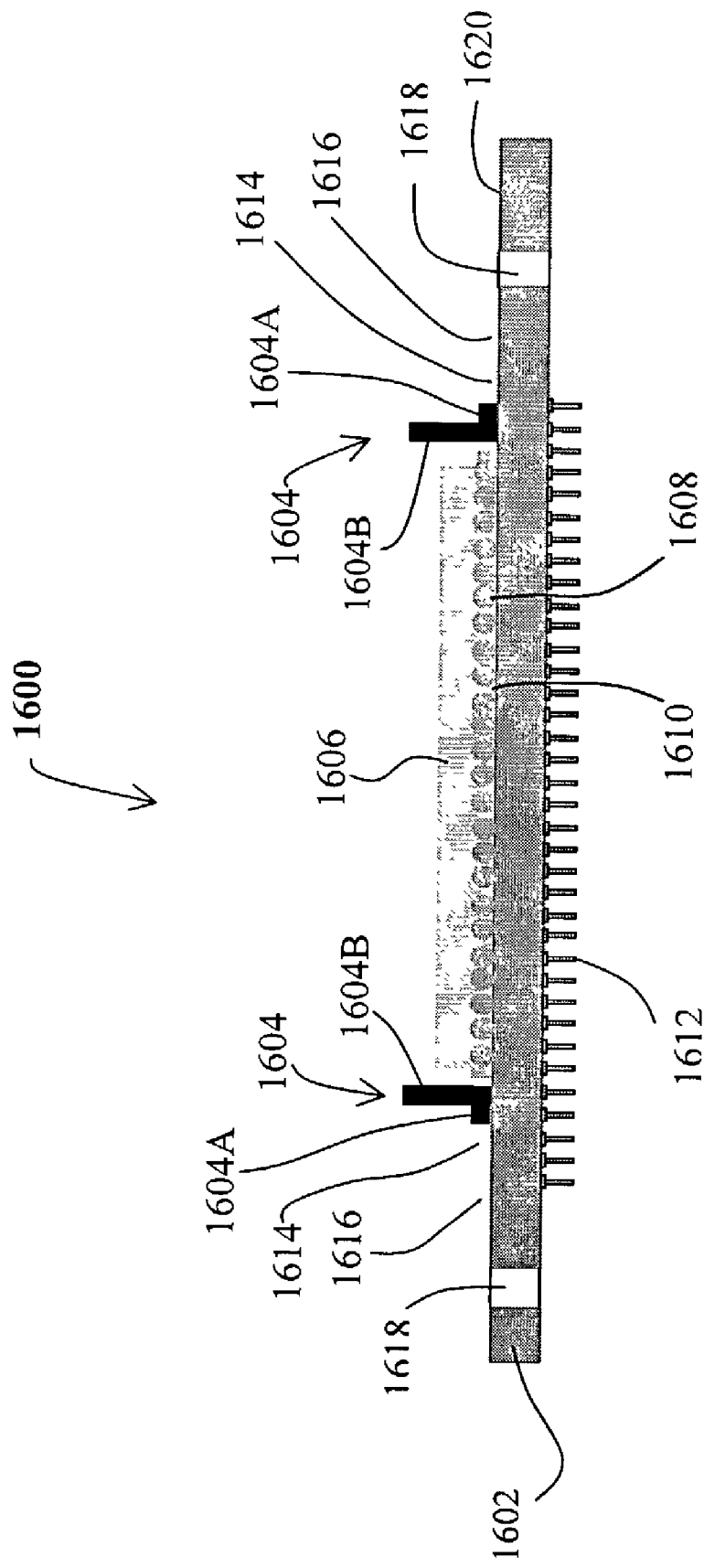
FIG. 16 is a diagram showing a second embodiment of the substrate assembly.

FIG. 16 is a diagram showing an embodiment of a substrate assembly 1600 for use with the power regulator and delivery module circuit board 602 with the compressible springs 1402 and 1404. The substrate assembly 1600 can be either a BUM or a CLGA substrate or similar. Unlike the substrate assembly 700 illustrated in FIG. 7, the substrate 1600 illustrated in FIG. 16 does not include a package lid 304 or thermal grease 312 (TIM-2). Also, unlike the substrate assembly 700 illustrated in FIG. 7, the substrate illustrated in FIG. 16 includes two precisely sized substantially non-conductive standoffs 1604A and 1604B.

In one embodiment, the non-conductive standoffs 1604 include a first portion 1604A which is coupled to the substrate 1602 near the processor 1606, and a second portion 1604B which extends from the substrate 1602. The processor 1606 is electrically coupled to the substrate 1602. This can be accomplished with C-4 connections 1608 to an array of metal pads (not shown) on the top surface of the substrate 1602. An underfill 1610 encapsulates the processor 1606. Conductive pins 1612 are electrically connected to the substrate 1602, and through circuit paths in the substrate 1602, metal pads, and C-4 connections, to the processor 1606.

Two (or more) conductive surfaces 1616 and 1614 are located on the top surface 1620 of the substrate 1602. The conductive surfaces 1616 and 1614 provide for electrical contact between the conductive standoff member 1400 (and hence the circuit board 602) and the substrate 1620. In one embodiment, the conductive surfaces 1616 and 1614 are concentric metal window frame areas, complimentary in shape, size, and location to the conductive surfaces 1306 and 1304. The inner frame area or ring 1614 is configured to accept the inner compressible springs 1402 and the outer frame area or ring 1616 is configured to make electrical contact with the outer compressible springs 1404 when the circuit board 1310 is aligned and mated to the substrate assembly 1600.

FIG. 16 also illustrates through holes 1618, that align and compliment through holes 1302 on the circuit board 1310. These holes are used for connecting the substrate assembly 1600 with the circuit board 1310, but are not needed for other connecting techniques, including, but not limited to those techniques using clips, clamps, or fasteners.

Figure 17:
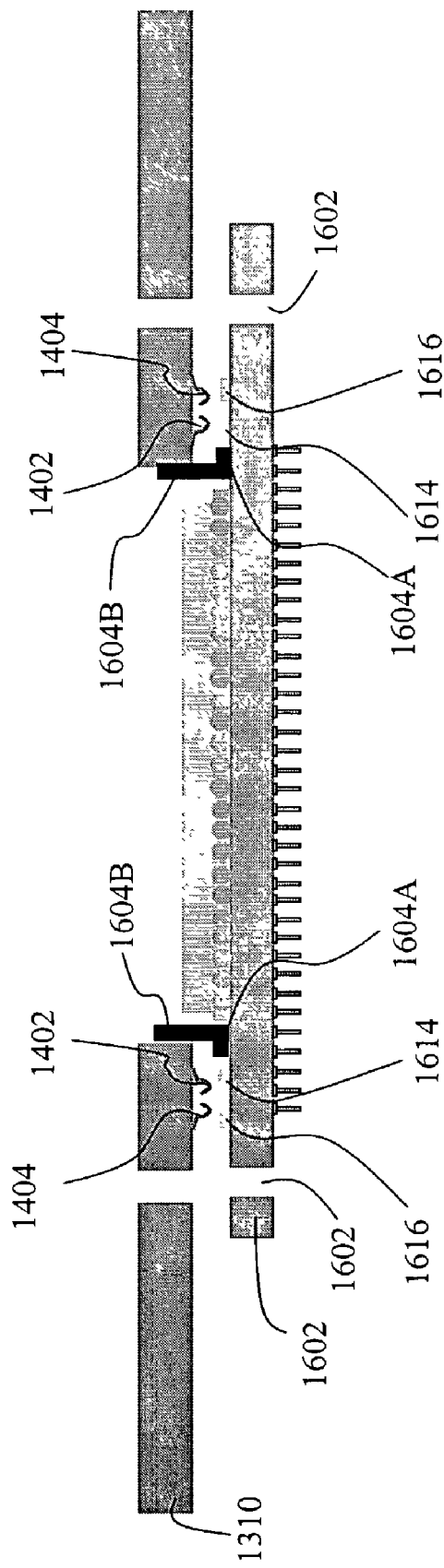
FIG. 17 is a diagram illustrating the power regulator module positioned and aligned over the substrate assembly.

FIG. 17 is a diagram illustrating the power regulator module 1300 (depicted in FIG. 15) positioned and aligned over the substrate assembly 1600. The edges of the cutout 1302 in the circuit board 1310 align with the standoffs 1604. The standoff 1604 includes first portion 1604A or a shoulder that is disposed to prevent the inner compressible springs 1402 and the outer compressible springs 1404 from bottoming out (potentially permitting undesirable contact between the bottom surfaces of the power regulator module 1300 and the top surfaces of the substrate assembly 1600, circuit board 1602 or components thereon). The standoff 1604 also includes a second portion 1604B of a vertical dimension selected such that when the power regulator module 1300 is mounted on the substrate assembly, the top surface of the second portion 1604B is substantially coplanar with the top surface of the power regulator module 1300, thereby presenting a substantially planar surface for inclusion of a heat dissipating device such as a heat sink, if desired.

Figure 18:
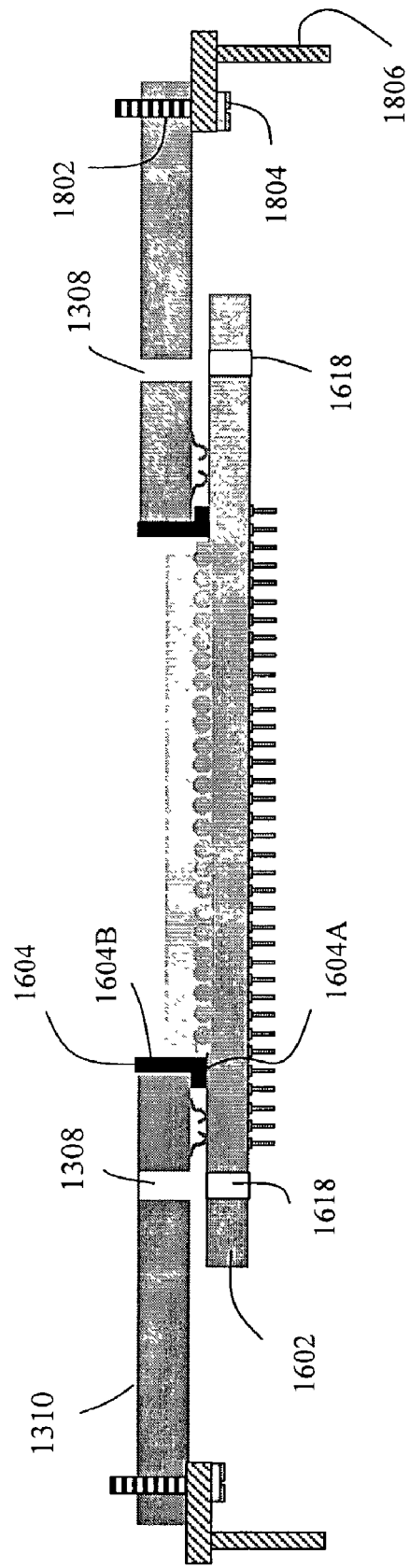
FIG. 18 is a diagram presenting the power regulator module and substrate assembly.

FIG. 18 is a diagram presenting an illustration of the configuration of FIG. 17 following placement of the power regulator and delivery module 1300 onto the substrate assembly 1600. The conductive surfaces 1614 and 1616 on the substrate 1602 align and physically touch inner compressible springs 1402 and outer compressible springs 1404, respectively. Fasteners, which can include clips, pins, clamps or other forms of mechanical joining are used to connect the power delivery module 1300 to the substrate assembly 1600. FIG. 18 shows an embodiment wherein apertures 1308 and 1618 align together to form a space in which a fastener may be inserted to affix the circuit board 1310 and the substrate 1602 together. FIG. 18 also shows an embodiment wherein the circuit board 1310 includes an aperture 1802 to accept a circuit board fastener 1804. An adaptation member 1806 is coupled to the circuit board 1310 via the fastener 1804.

In one embodiment, the top surface of the standoff 1604 slightly protrudes above the top surface of the power delivery module 1300. The standoff 1604 can be configured without the shoulder portion 1604A if desired for other connections such as, but not limited to, solder balls, raised metal pads or short metal posts or, for cases where the micro-springs can support the weight of the power regulator module without bottoming-out the springs.

Figure 19:
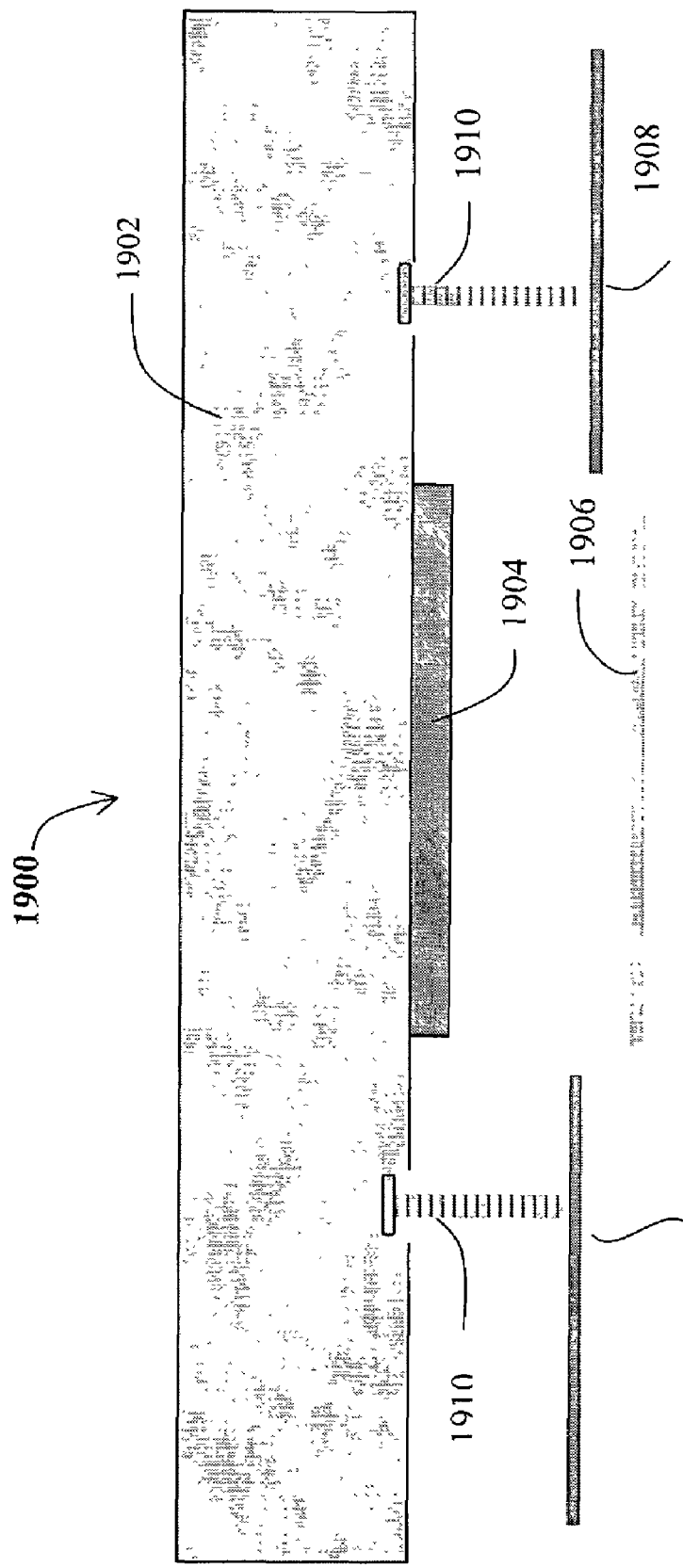
FIG. 19 is a diagram showing one embodiment of an integrated thermal power dissipation system.

FIG. 19 is a diagram showing one embodiment of an integrated thermal power dissipation system 1900 for use in the micro i-PAK architecture. An integrated heatsink 1902 is thermally coupled to a high thermal conductivity spacer plate 1904 to form a monolithic unit. For certain applications where the thickness of the microprocessor silicon 1606 is comparable to the thickness of the power delivery module circuit board 1310, the spacer plate 1904 is not needed. A thermal grease (e.g. TIM-1) 1906, physically contacts the underside of the spacer plate or contacts the underside of the heatsink 1902 if the spacer plate 1904 is not used. A second thermal grease 1908 contacts the underside of the heatsink 1902 away from the spacer plate 1904 or TIM-1 1906, if the spacer plate 1904 is not used. In the illustrated embodiment, alignment fasteners 1910 are affixed within recesses 1912. Although not necessary to practice the present invention, recesses 1912 provide clearance for the integrated heatsink 1902. Other embodiments using fasteners with heads designed to be flush with the bottom surface of the integrated heatsink 1902 or to fit within specially designed recesses 1912 are also possible. The fasteners 1910 are placed through the apertures or holes 1618 and 1308 as described below.

Figure 20:
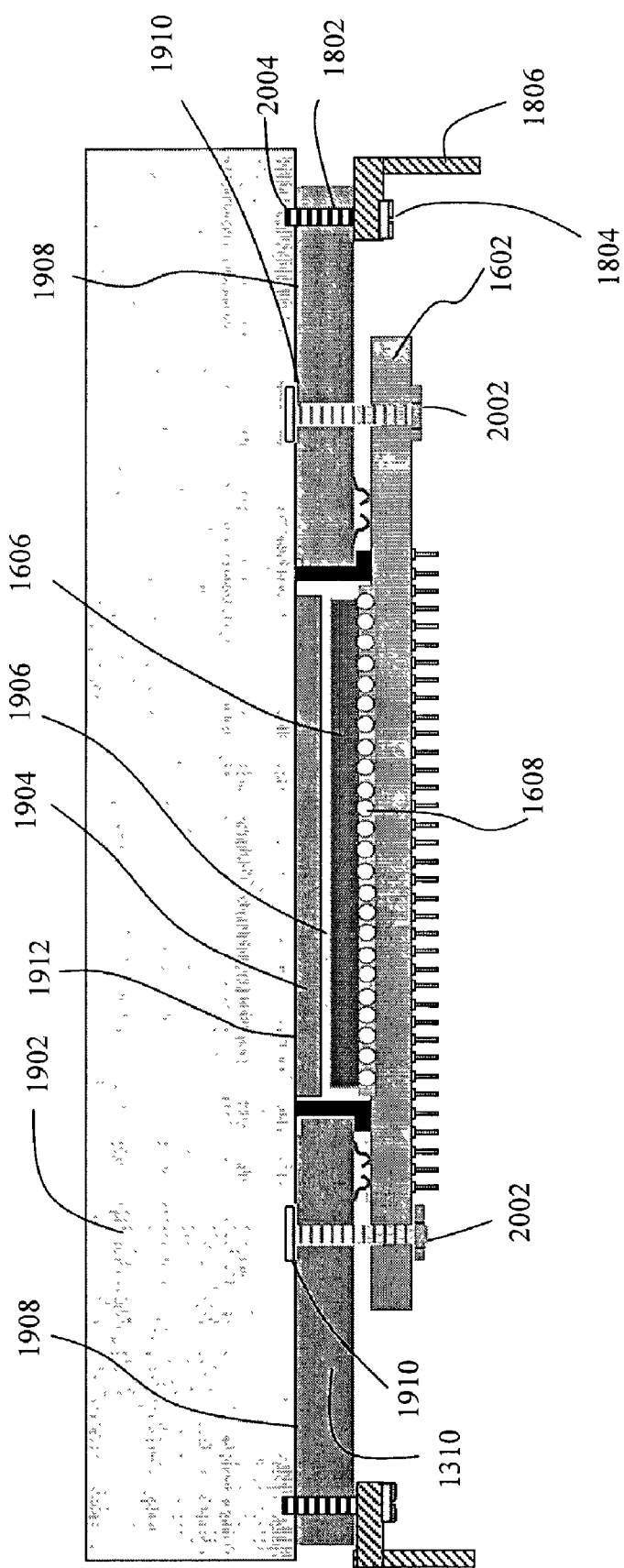
FIG. 20 is a diagram illustrating one embodiment of the present invention with including the power regulator, substrate assembly, and the integrated thermal power dissipation system.

FIG. 20 is a diagram illustrating the configuration of the micro i-PAK architecture following the attachment of the integrated thermal power dissipation system to the substrate 1602 and power regulator and delivery module 1300. The top surface of the microprocessor 1606 physically contacts the thermal grease 1906 which contacts the spacer plate 1904 (if needed). The base of the integrated heatsink 1902 contacts the top surface 1912 of the non-conductive standoff 1604. The non-conductive standoff 1604 absorbs the weight of the heat sink 1902 and the spacer plate 1904, and to eliminates the mechanical stress that would otherwise be placed upon the C-4 connections 1608 by the integrated thermal power dissipation system 1900. The thermal grease 1908 occupies the gap between the circuit board 1310 and the heatsink 1902 to provide a thermal power dissipation path from the power regulator and delivery module to the integrated heatsink 1902. The fasteners 1910 may protrude into recesses 1912 located in the heatsink 1902. Nuts or similar devices 2002 are affixed to the fastening devices 1910 to bring the substrate 1602 and the circuit board 1310 together, and bring the heatsink, circuit board 1310, and substrate 1602 into alignment. The heat sink 1902 includes recesses 2004 that accept the fastener 1804 and affix the heat sink to the circuit board 1310 (and hence, the substrate 1602, which is attached to the circuit board 1310 by the alignment fasteners and the nuts 2002).

Figure 21A:
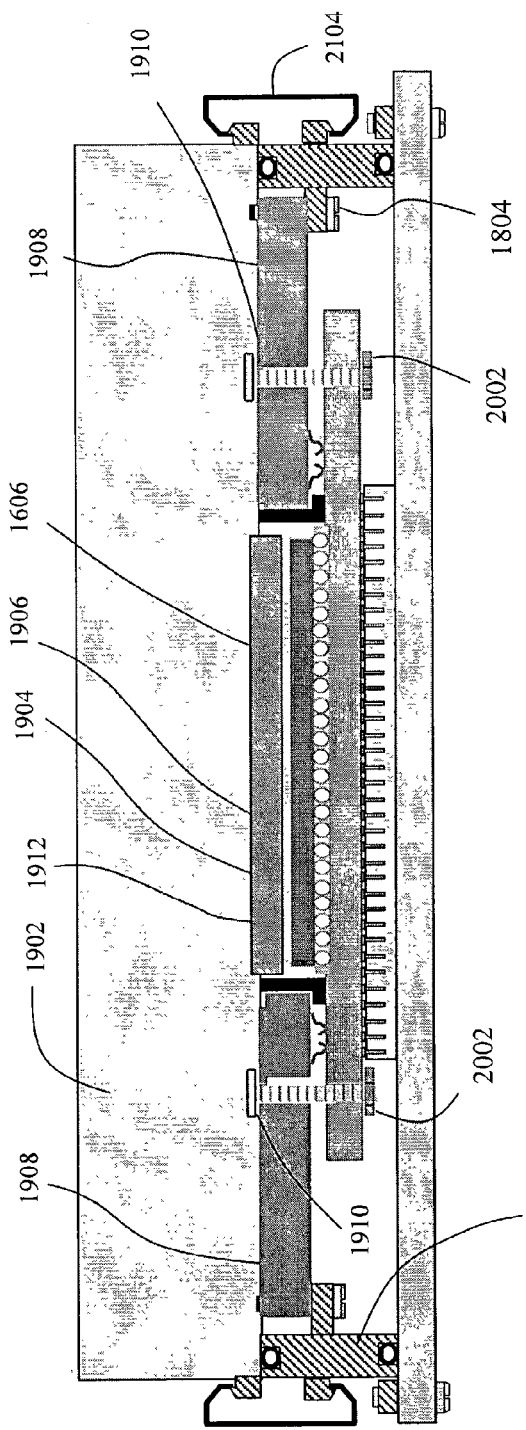
FIGS. 21A and 21B are diagrams of the assembly of FIG. 20 further modified to minimize EMI.

FIG. 21A shows an extension of the integrated architecture for the micro i-PAK architecture to incorporate a frame assembly for reducing EMI 2102. The EMI frame 2102 mechanically connects to the integrated heatsink 1902 via fastener 1804 to form an enclosure that can be configured with accompanying hardware and an electrically conductive stiffener board or motherboard to form a three dimensional enclosure for the microprocessor or electronic circuits, power regulator and delivery module and associated components. Clips 2104 can be used to further mechanically couple the heatsink 1902 to the remainder of the assembly. This configuration provides EMI containment at the package level, in this case, micro i-PAK, rather than at the chassis level.

Figure 21B:
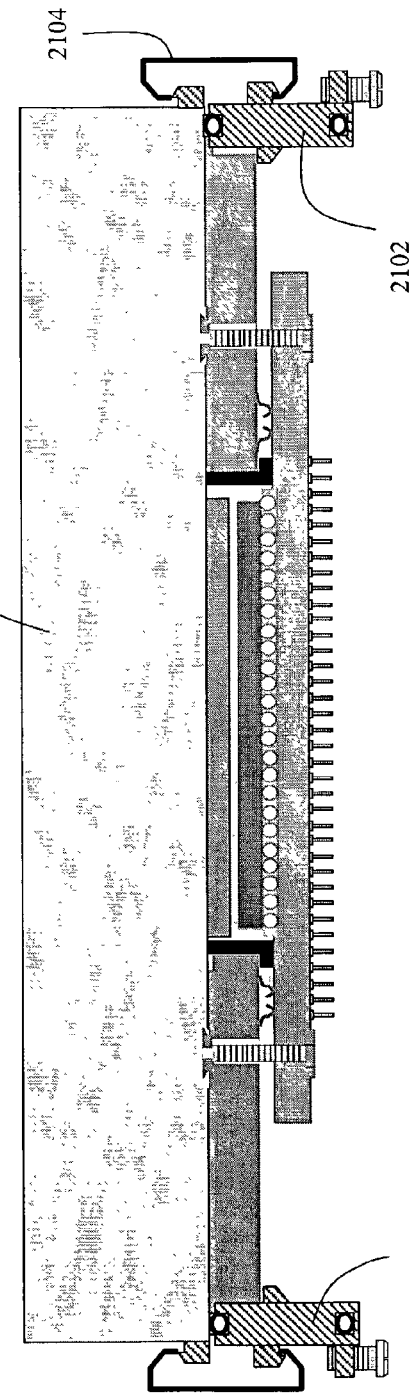

FIG. 21B illustrates a modified embodiment of the integrated architecture in which the integrated heatsink 1902 is coupled to the remainder of the assembly via clips 2104 alone. Different combination of screws, dowels, clips and the like can be used to align the elements of the integrated assembly and affix them together.

Regardless of the method used, when the fasteners are properly tightened or positioned, the bottom surface of the circuit board 1310 resides on the shoulder 1604A of the standoff 1604 to provide precise electrical connection between the conductive surfaces 1304 and 1306 and conductive surfaces 1616 and 1614, via second conductive standoff portion 1404 and first conductive standoff portion 1402, respectively.

The electrical connection shown in FIG. 18 between the power delivery module 1300 and the substrate 1602 with microprocessor or electronic circuits can take a variety of forms and need not be limited to spring connections with fasteners. The connection can include, but is not limited to, solder bonding, mechanical joining or diffusion bonding. For, example, a dielectric adhesive layer can be pre-applied to either the circuit board 1310 or substrate 1602 to provide mechanical strength between the two surfaces in a manner similar to the use of underfill for solder bump (C-4) protection.

The third example of the integrated architecture is described by a Monolithic Enabling Module (MoEM). MoEM is an extension of the micro i-PAK architecture. MoEM provides a monolithic package that incorporates in-package-voltage regulation (IPVR) directly onto the substrate and permits pre-testing of the configuration prior to attachment of the microprocessor or electronic circuits.

Figure 22:
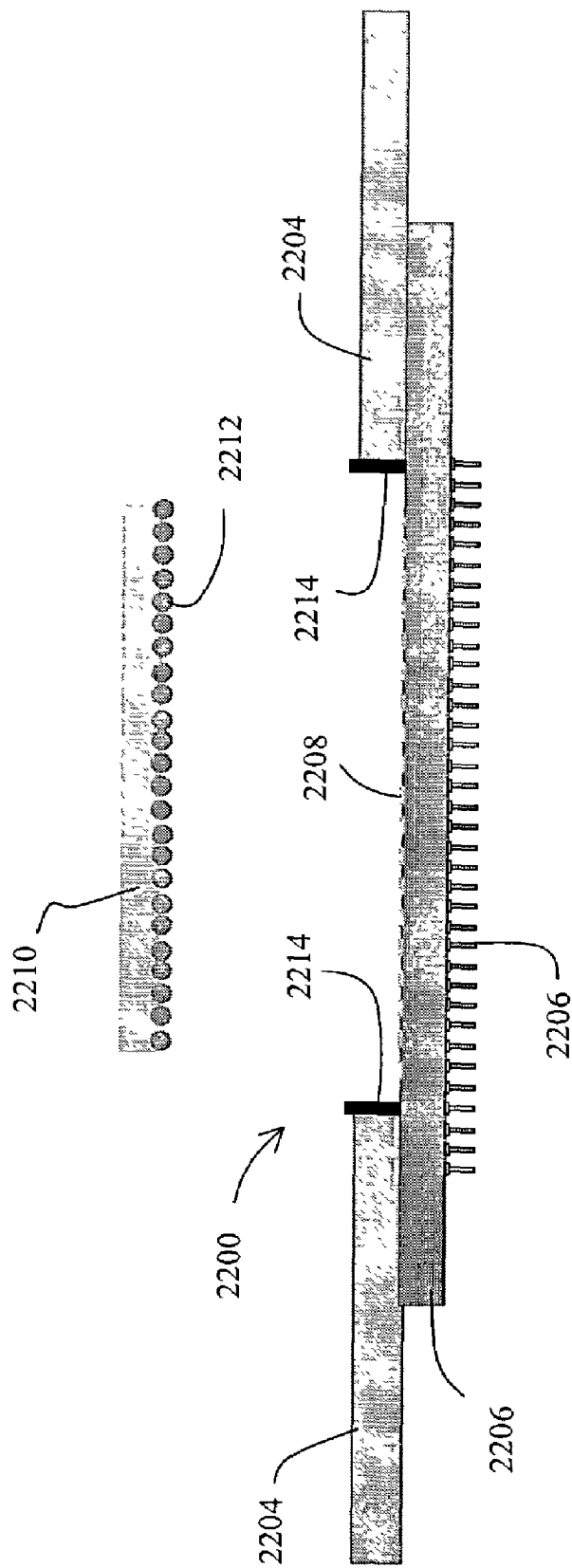
FIG. 22 is a diagram illustrating one embodiment of a Monolithic Enabling Module.

FIG. 22 is a diagram illustrating one embodiment of the MoEM 2200. The MoEM includes a substrate 2202 and an IPVR module 2204 both of which are permanently configured to be connected electrically and mechanically to each other. An array usually configured as, but not limited to metal pins 2206, is positioned on the underside of the substrate 2202 to form electrical paths through the substrate 2204 to an array of, but not limited to, metal pads 2208 located in the central portion of the top surface of the substrate 2202. A portion of the metal pads 2208 are power and ground connections that are electrically connected to the IVPR module 2204 through metal planes in the substrate 2202. Standoffs 2214 are positioned on the top surface of the substrate 2202 to protrude slightly above the surface of the IVPR module 2204.

The array of metal pads 2208 correspond to the input/output footprint of the microprocessor or electronic circuits 2210 which is configured with an array of solder bumps 2212 that are permanently bonded to the microprocessor 2210 and form the input/output connection for the electronic circuits. Each of the solder bumps in the array of solder bumps 2212 are disposed to make electrical contact with a respective metal pad 2208.

In another embodiment of this invention for MoEM 2200, the array of metal pads 2208 can be configured as microsocket pins to accept the array of solder bumps 2212 of the microprocessor or electronic circuits 2210. The MoEM 2200 then functions as a test socket for the microprocessor 2210 or as a package wherein the microprocessor is not permanently attached to the MoEM 2200 and can be mechanically removed.

FIGS. 23A-23D are diagrams illustrating one embodiment of a method for attaching the microprocessor or electronic circuits 2210 into the substrate 2202 when not configured as a test socket.

Figure 23A:
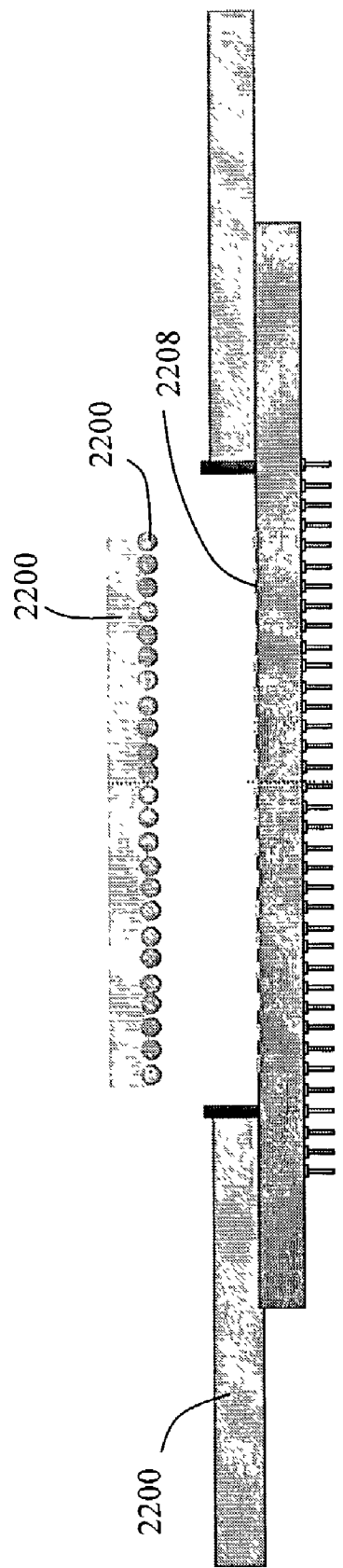
FIGS. 23A-23D are diagrams illustrating one embodiment of a method for electrically coupling the microprocessor circuits to the substrate.

In FIG. 23A, the microprocessor 2210 is positioned over a cavity formed by the substrate 2202, and standoffs 2214.

Figure 23B:
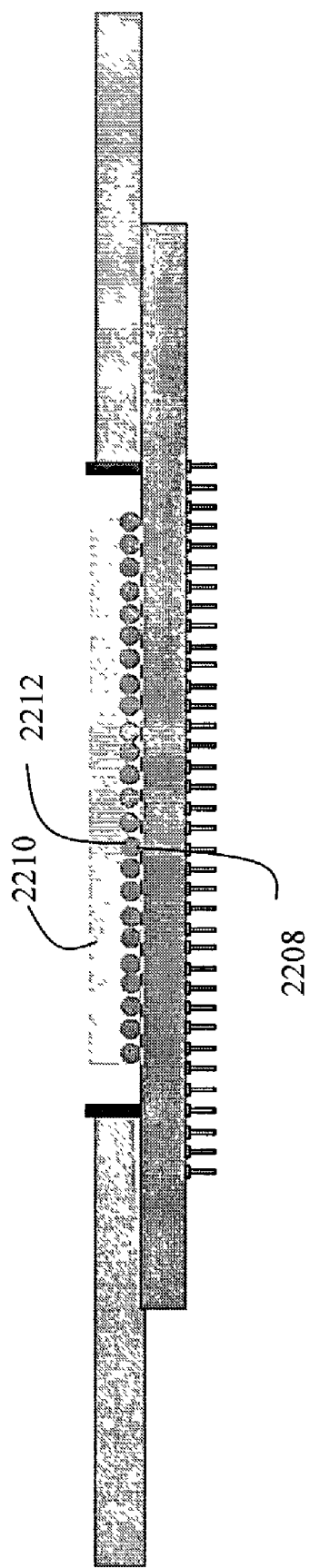

In FIG. 23B, the microprocessor 2210 is placed onto the array of metal pads 2208 such that the solder bumps 2212 physically contact the metal pads 2208. After placement, the solder bumps 2212 and pads 2208 form metallurgical connections using the C-4, reflow soldering method.

Figure 23C:
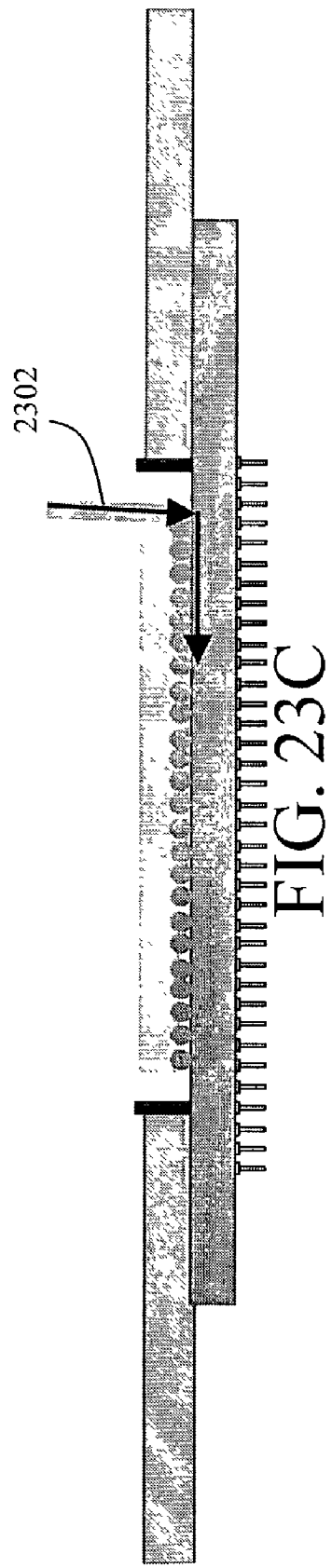

After the solder reflow step, FIG. 23C illustrates the application of an underfill 2302 which can be a thermoset or thermoplastic resin loaded with dielectric fillers.

Figure 23D:
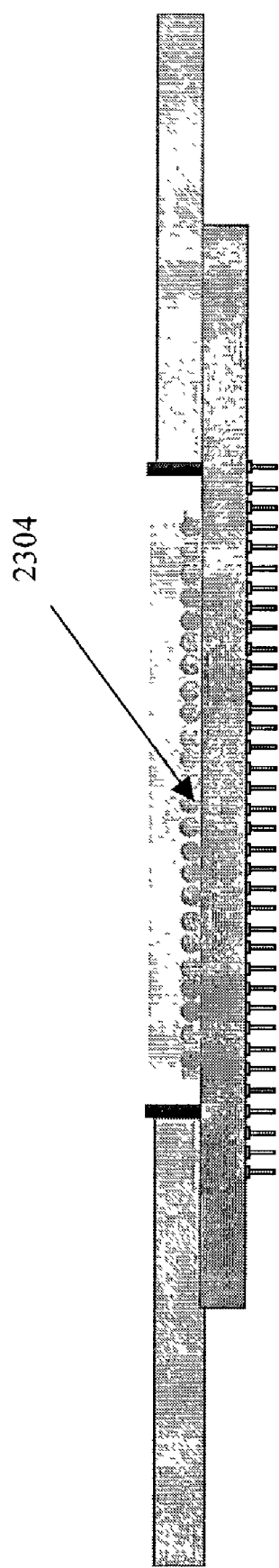

FIG. 23D is a diagram showing the completed connection after the underfill is cured or hardened 2304.

Figure 24:
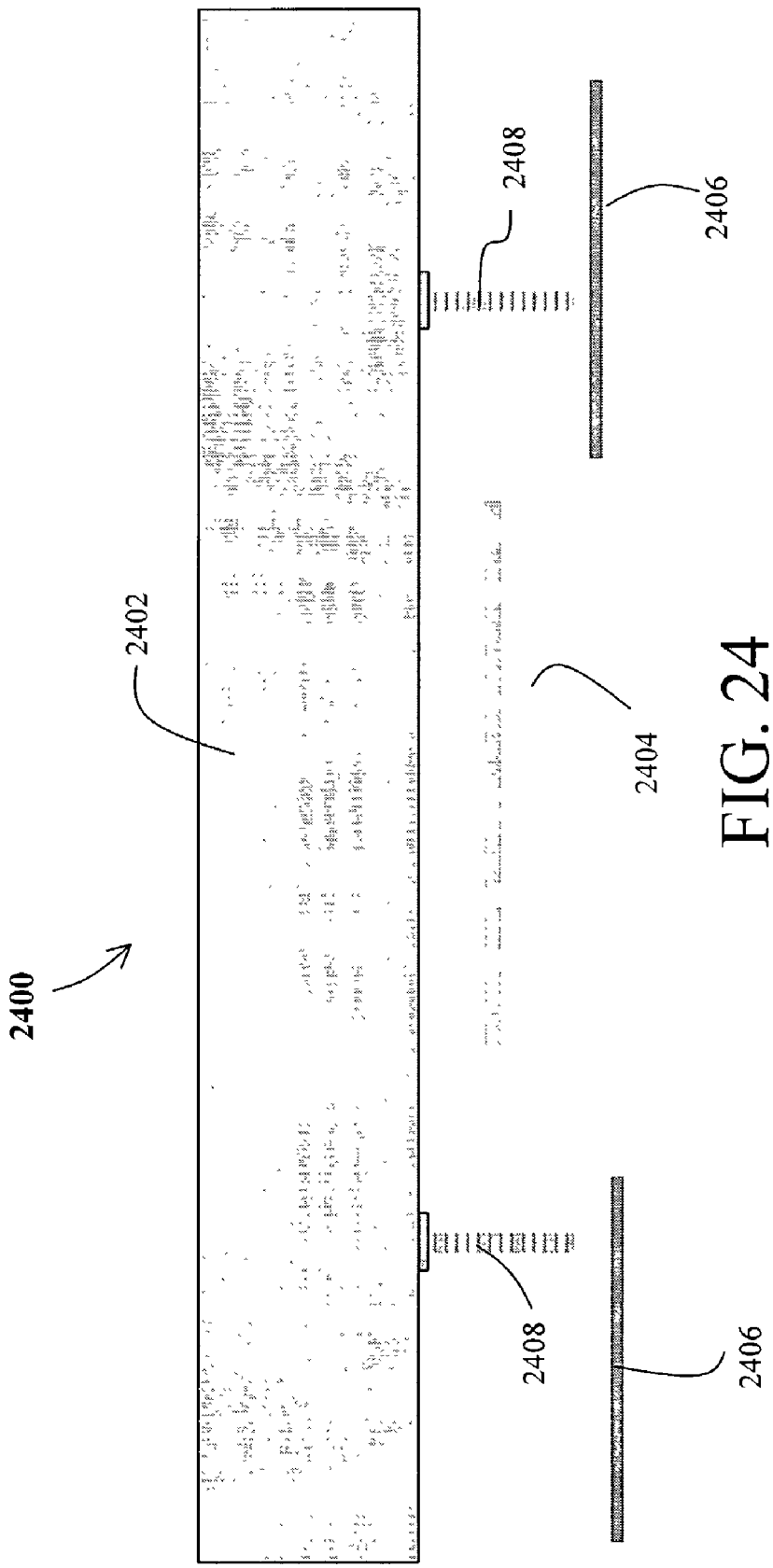
FIG. 24 is a diagram illustrating another embodiment of an integrated thermal power dissipation module.

FIG. 24 is a diagram illustrating an integrated thermal power dissipation module 2400. The module 2400 comprises an integrated heatsink, 2402, a thermal grease such as TIM-1 2404 and second thermal grease 2406. Alignment pins or screws 2408 can be glued, brazed, or otherwise attached to the integrated heatsink 2402.

Figure 25:
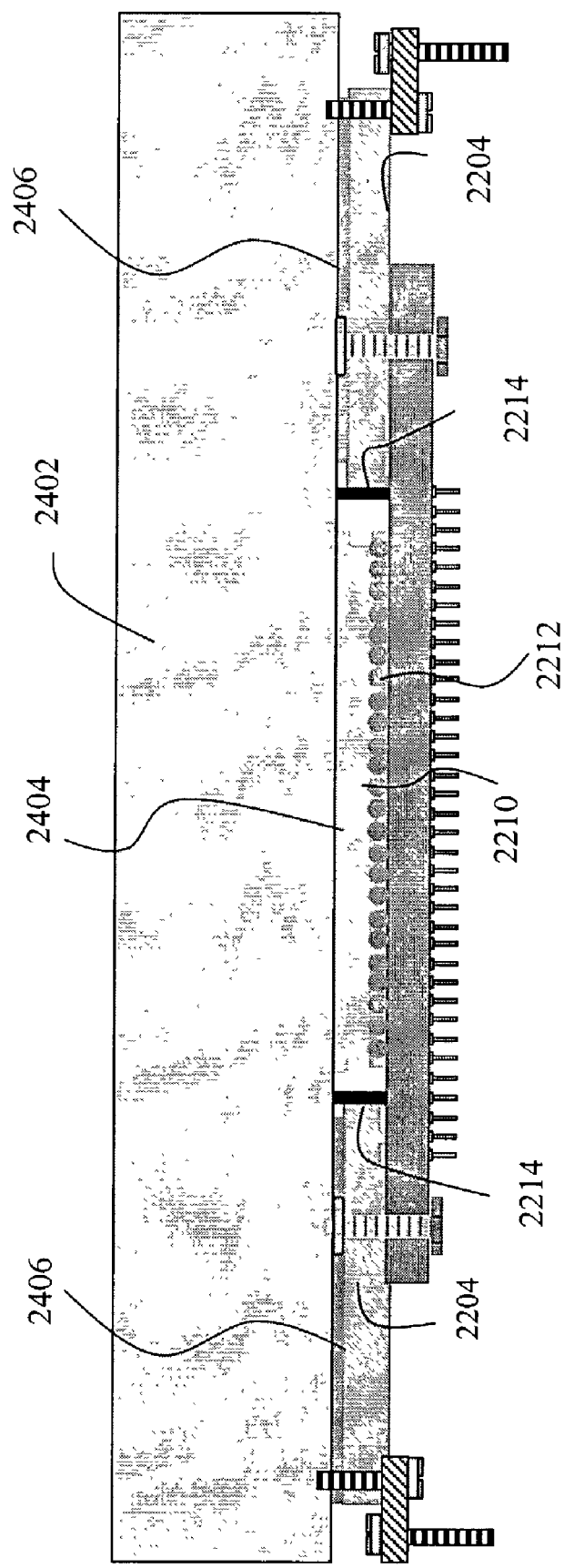
FIG. 25 is a diagram showing the use of an integrated thermal power dissipation module with the Monolithic Enabling Module.

FIG. 25 is a diagram showing the attachment of the integrated heatsink 2402 with thermal greases 2404 and 2406 to the MoEM 2200. The base of the integrated heatsink 2402 is positioned vertically by the standoffs 2214. The thermal grease, TIM-1, 2404 directly contacts the back surface of the microprocessor or electronic circuits 2210 to form a direct thermal power dissipation path to the integrated heat sink 2402. The top surface of the IVPR module 2204, directly contacts the thermal grease 2406 to form a thermal power dissipation path from the top surface to the integrated heat sink. Because the vertical standoffs 2214 support the integrated heatsink 2402, minimal compressive force is exerted by the weight of the heatsink 2402 into the solder bump connections 2212. For cases where the substrate 2204 is significantly thicker than the microprocessor or electronic circuits, a high thermal conductivity spacer plate (not shown) can be physically and mechanically attached to the integrated heatsink 2402 and configured to contact the thermal grease (TIM-1) 2404.

Figure 26:
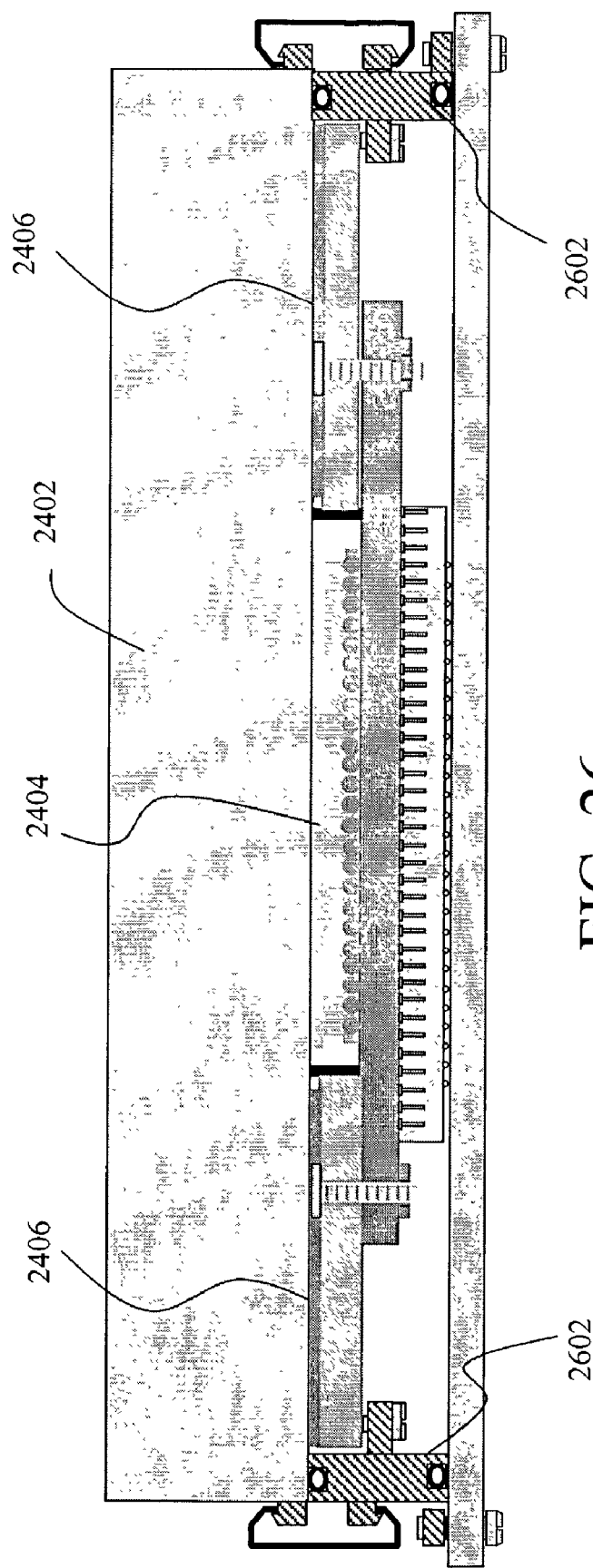
FIG. 26 is a diagram showing a modification of the Monolithic Enabling Module and integrated thermal power dissipation module with an EMI reduction frame assembly.

FIG. 26 is a diagram showing an extension of the integrated architecture for the MoEM to incorporate the EMI reduction frame assembly 2602. The EMI frame 2602 electrically and mechanically connects to the integrated heatsink 2402 to form an enclosure that can be configured with accompanying hardware and an electrically conductive stiffener board to form a three dimensional enclosure for the circuitry associated with the microprocessor or electronic circuits.

Other Conductive Standoff Embodiments

Figure 27:
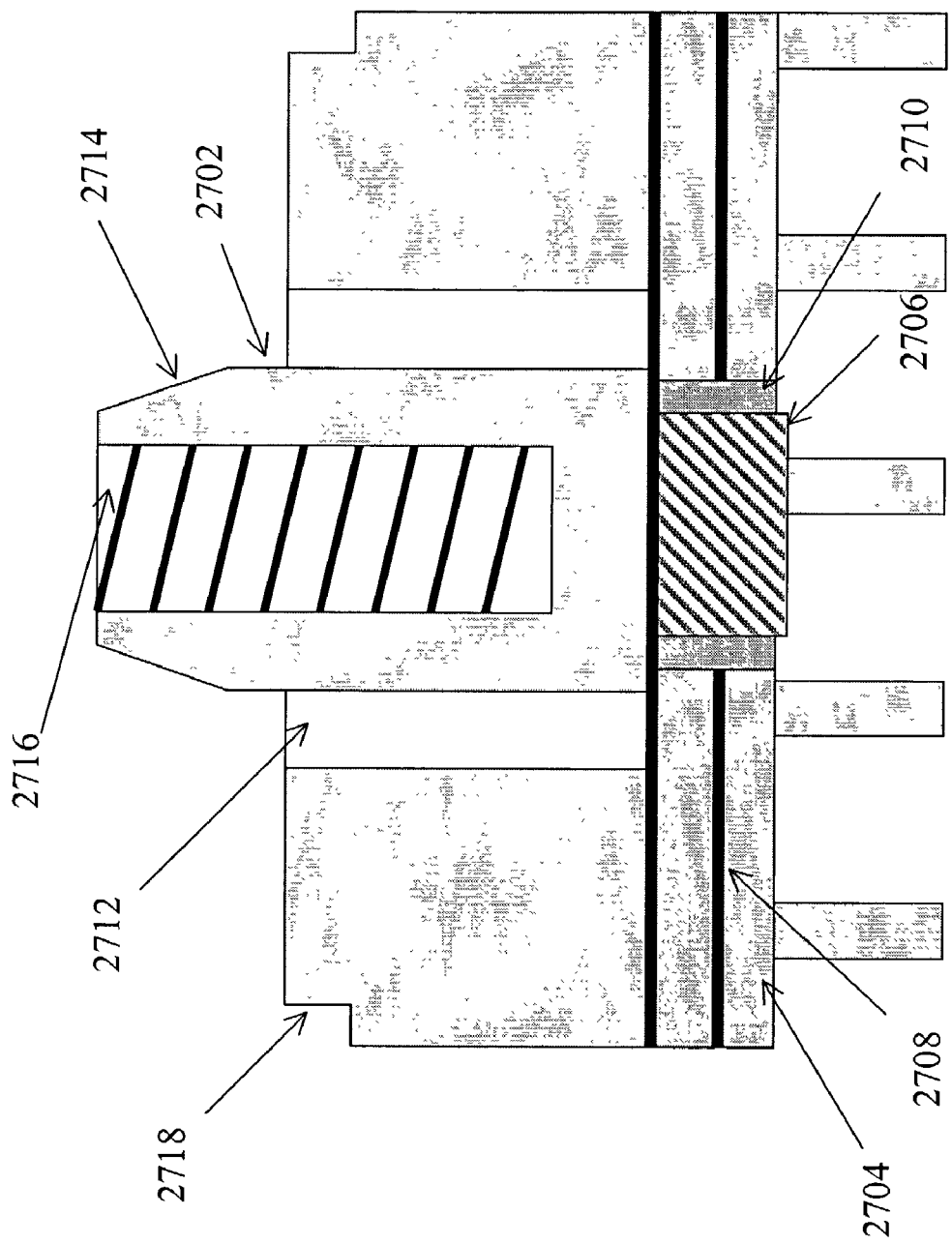
FIG. 27 is a diagram showing another embodiment of a portion of the conductive interconnect device.

FIG. 27 is a diagram showing another embodiment of the conductive interconnect device 2700 similar to that which is disclosed in FIG. 6 as element 612. In this embodiment, a power pin 2702 is mounted to substrate 2704 through a connection device such as solder or press pin 2706 which connects electrically to inter-plane 2708 in the substrate 2704. Solder or press pin 2706 is connected to plated through-hole 2710 electrically and mechanically. A dielectric insulator 2712 isolates the power pin 2702 from a ground portion 2718. The hollow center section 2716 of the power pin 2702 is threaded for accepting a screw. Additionally, tapered top portion 2714 is constructed to allow an electrical joint attachment.

Figure 28:
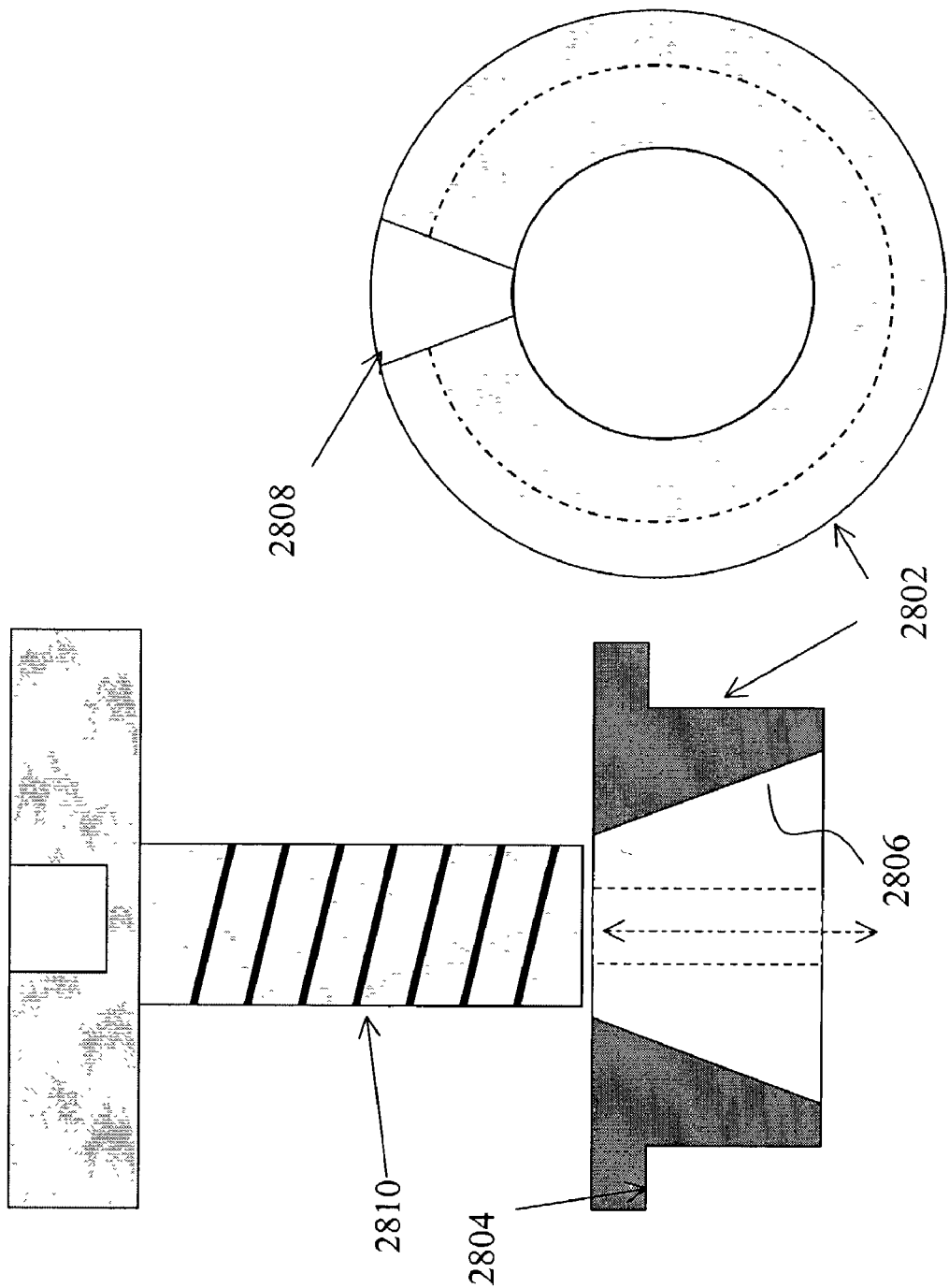
FIG. 28 is a diagram further illustrating a second portion of the conductive interconnect device with a split wedge washer and screw fastener.

FIG. 28 is a diagram illustrating a split-wedge washer and screw fastener construction for use with the constructive standoff device illustrated in FIG. 27. The split-wedge washer 2802 includes a lip portion 2804 for a circuit board in contact therewith toward the substrate 2704. Wedge section 2806 includes a taper 2806 substantially adapted to the taper 2714 of the power pin 2702. Split section 2808 allows the washer 2802 to expand and contract along a circumferential axis as the matching taper portions are forced together as the screw 2810 is inserted into the center section 2716.

Figure 29:
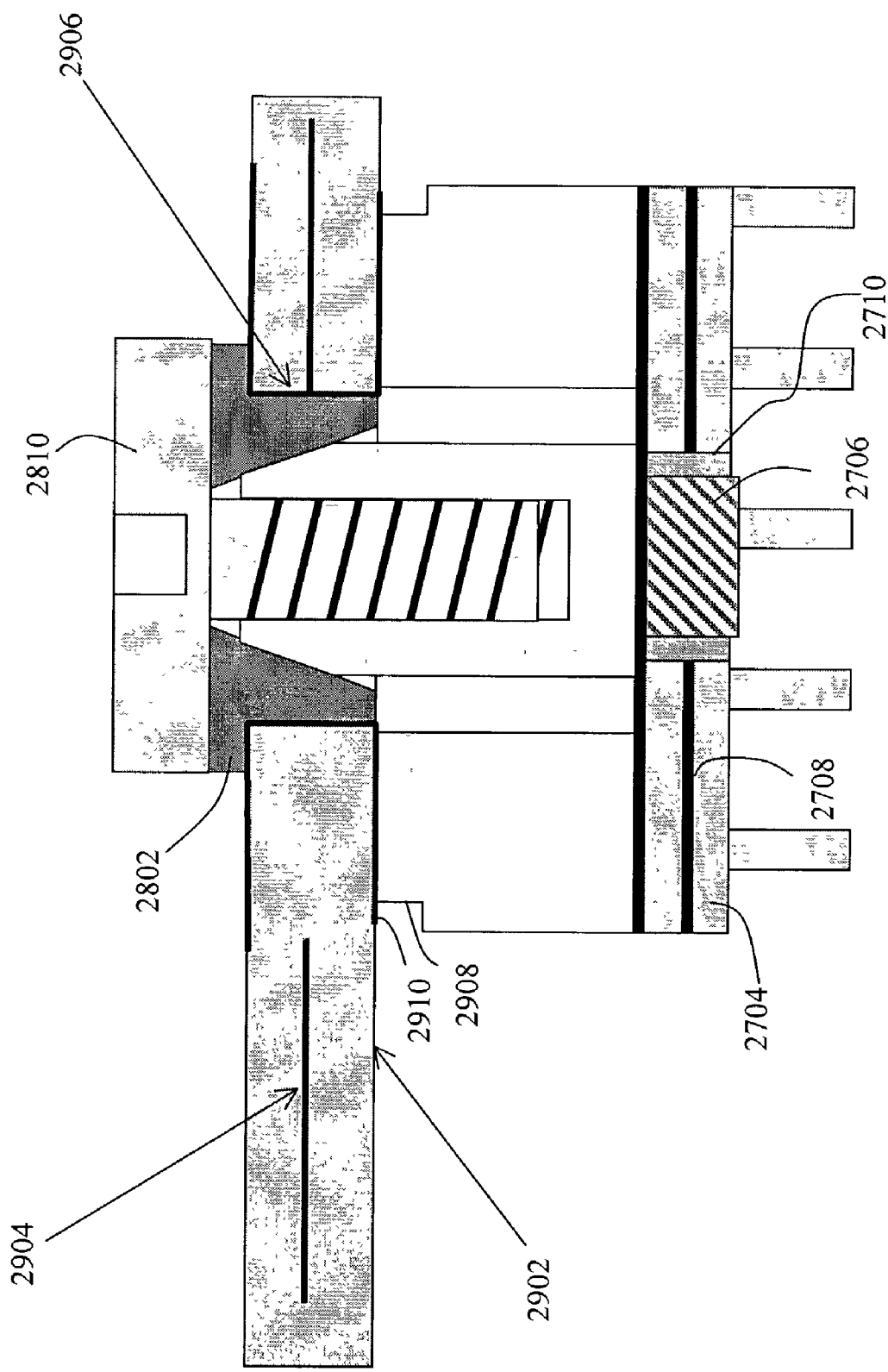
FIG. 29 is a diagram showing the assembled conductive interconnect device.

FIG. 29 is a diagram showing the attachment of the elements of FIG. 28 with the structure shown in FIG. 29 and integrated with a circuit board 2902 having, for example, power conditioning circuitry. The split-wedge washer 2802 engages electrically and mechanically to the side of plated through hole 2906 in the circuit board 2902 by having taper section 2806 of the washer 2802 spread outward to force against the interior surface of the plated through hole 2906.

At the same time, screw fastener 2810 forces the circuit board 2902 towards the substrate 2704 by pulling the washer 2802 against the circuit board 2902 and pulling the ground portion 2718 against the circuit board. Inter-power plane 2904 is attached electrically to plated through-hole 2906 which connects to power distribution on the circuit board. Additionally, ground pad 2908 is attached electrically to bottom pad 2910 of the circuit board 2902 to complete electrical circuit through vias which are electrically coupled to the ground plane on circuit board 2902.

Figure 30:
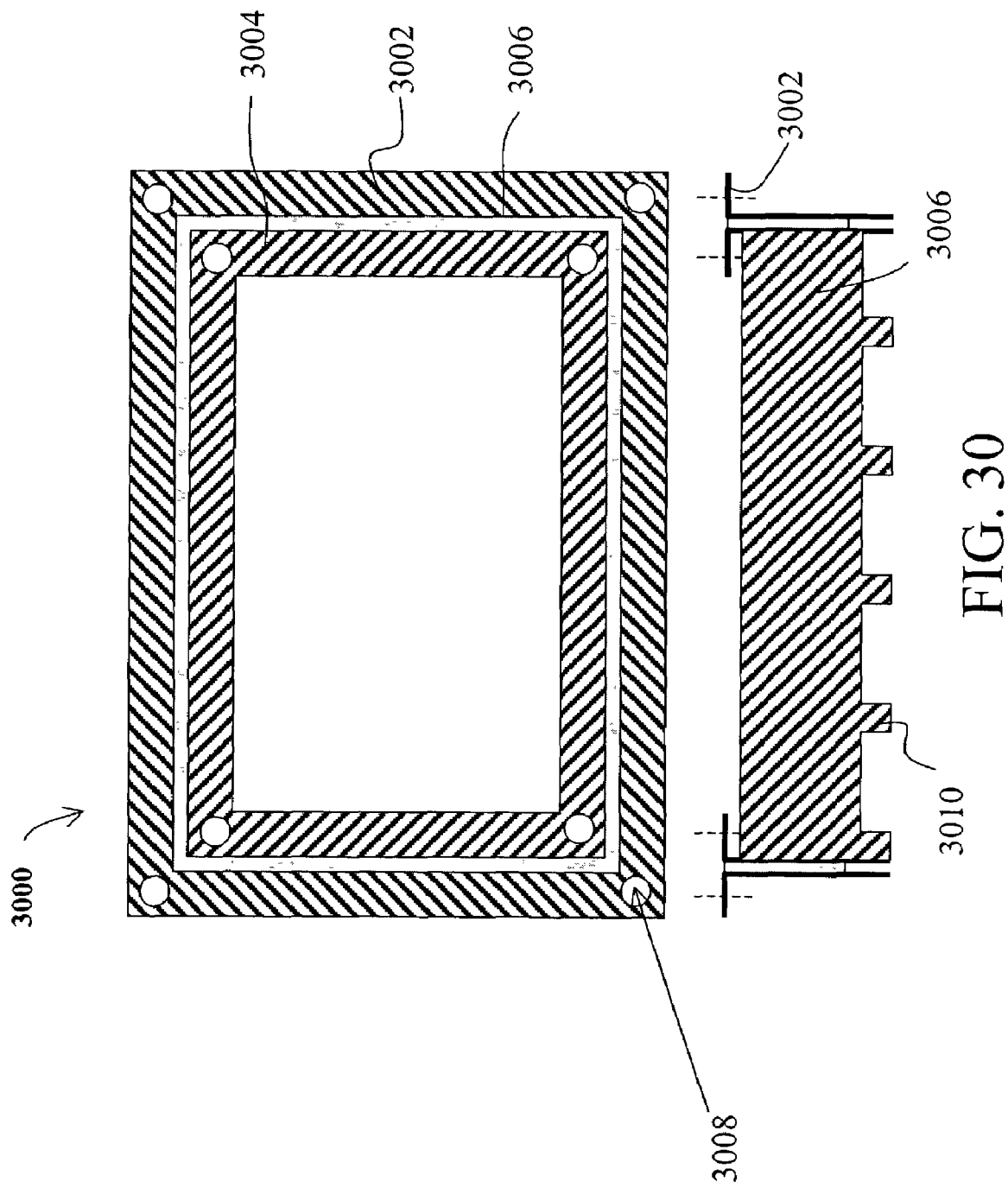
FIG. 30 is a diagram showing a further embodiment of the conductive interconnect device.

FIG. 30 illustrates a low inductance conductive 'frame' standoff sub-assembly 3000. A sheet metal frame is bent and joined at one corner to form an outer ground frame 3002 with solder tabs 3010 for mounting permanently a circuit board (either INCEP board or main board). A dielectric material such as dielectric tape 3006 is attached to this structure as an insulator. Inner frame 3004 is made in similar fashion to the outer frame 3002 but carries current (e.g. from a positive terminal of power supply) to supply power to the component. Mounting holes 3008 are supplied to mount to one side of the assembly to make mechanical and electrical connection. Due to the dimensions of the construction, and the current paths for the electrical interconnect, a very low inductance can be achieved resulting in a low voltage drop between the power supply and load for low frequency switching applications.

Figure 31:
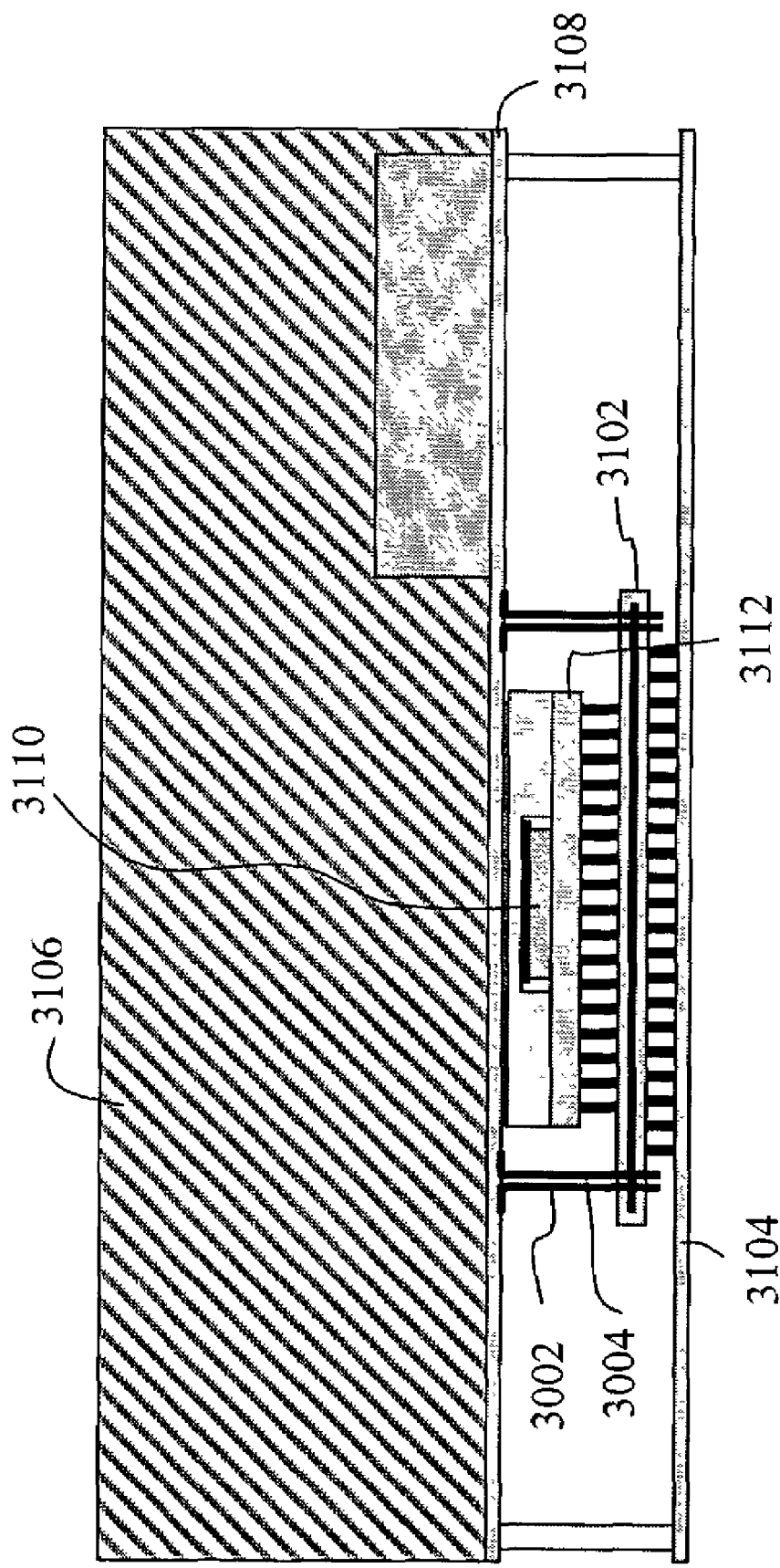
FIG. 31 is a diagram showing a cross-sectional view showing an implementation of the embodiment of the conductive interconnect device illustrated in FIG. 30.

FIG. 31 is a diagram presenting an cross sectional view showing one implementation of the low inductance frame standoff sub-assembly 3000. In this embodiment, a processor 3110 is electrically coupled to a substrate 3112, which is electrically coupled to an interface board 3102, which is coupled to a main board 3104. Power and ground connectivity is supplied from circuit board 3108 to the interface board 3102 by the inner 3004 and outer 3002 frame members, and thence to the processor via substrate 3112. The interface board 3102 is to remove any need to mount power directly to the main board which can improve rout ability and cost on the main board.

Figure 32:
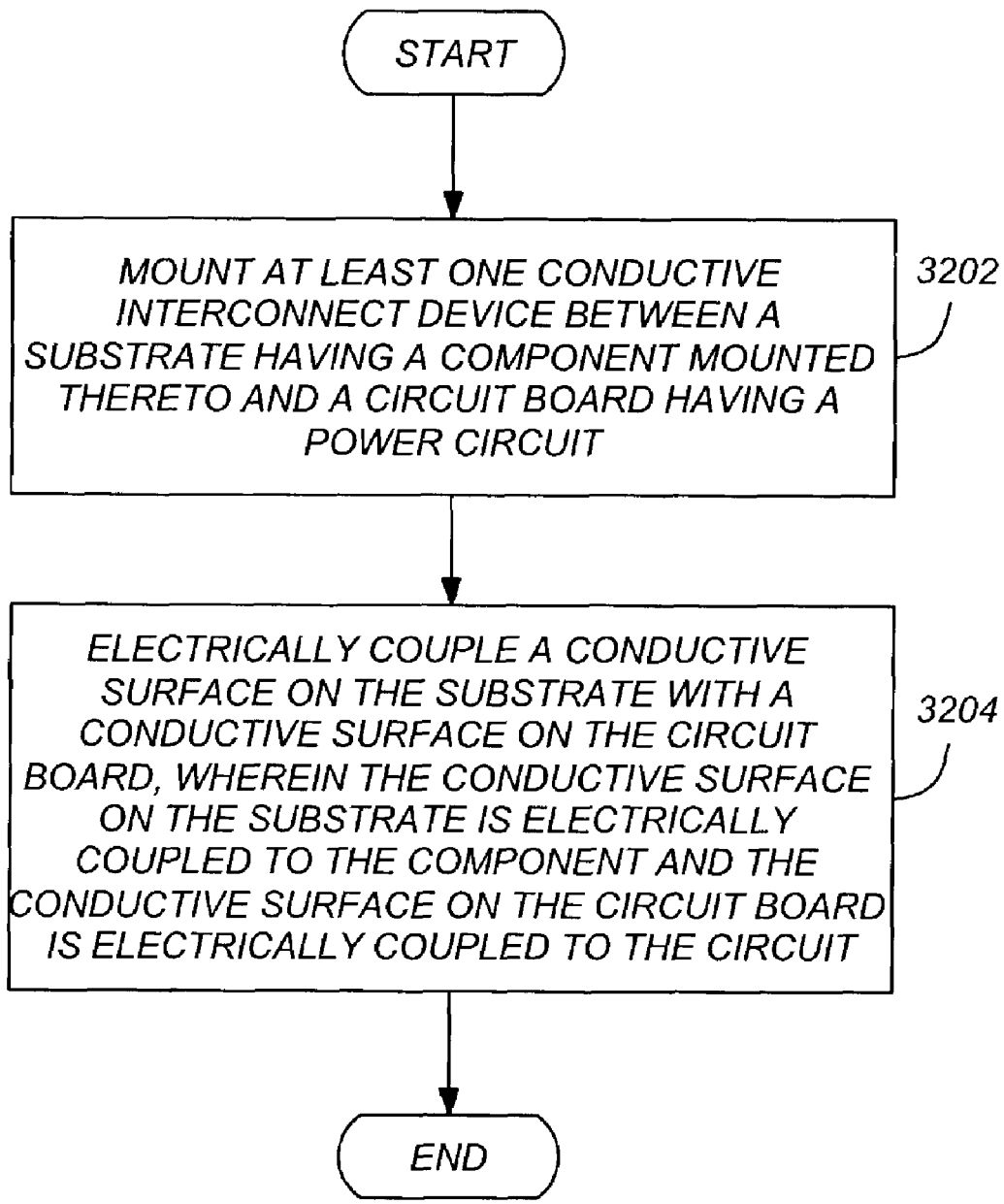
FIG. 32 is a diagram showing exemplary method steps used to practice one embodiment of the present invention.

FIG. 32 is a diagram presenting illustrative method steps used to practice one embodiment of the present invention. At least one conductive interconnect device is mounted 3202 between a substrate having a component mounted thereto and a circuit board having a power circuit. A electrically conductive surface on the substrate is electrically coupled with an electrically conductive surface on the circuit board through the conductive interconnect device, as shown in block 3204.

Figure 33:
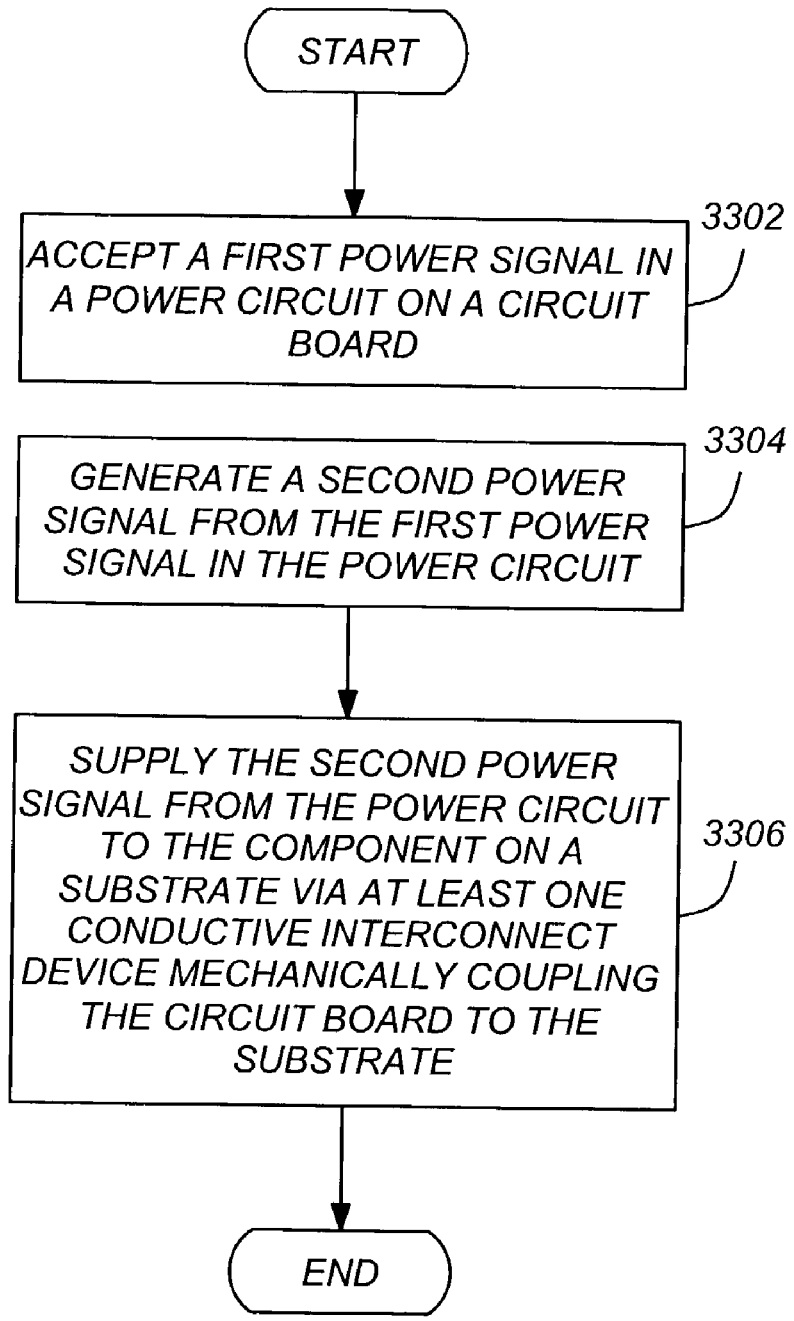
FIG. 33 is a diagram showing exemplary method steps used to practice a further embodiment of the present invention.

FIG. 33 is a diagram presenting illustrative method steps used to practice another embodiment of the present invention. A first power circuit signal is accepted 3302 in a power circuit implemented on a circuit board. A second power signal is generated 3304 from the first power signal. In one embodiment, the first power signal is a high-voltage/low-current signal, and the second power signal is low-voltage/high-current signal. In another embodiment, the second power signal is a conditioned or regulated modification of the first power signal. The second power signal is supplied 3306 from the power circuit to the component on a substrate via at least one conductive interconnect device mechanically coupling the circuit board to the substrate.

CONCLUSION

This concludes the description of the preferred embodiments of the present invention. The present invention discloses a three-dimensional interconnection architecture for electronic circuits, such as microprocessors, that integrates power delivery, thermal power dissipation, Electromagnetic Interference (EMI) reduction, signal integrity/performance, manufacturability, reliability, cost effectiveness and form factor optimization.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A modular power delivery system comprising:
a voltage regulation circuit board having a first side and a second side;
a substrate assembly having a first side and a second side and including a microprocessor disposed on said first side of said substrate assembly said substrate assembly being mechanically and electronically coupled to said voltage regulation circuit board with said first side of said substrate assembly facing said second side of said voltage regulation circuit board; and
a motherboard electronically and mechanically coupled to said substrate assembly;
wherein the voltage regulation circuit board further comprises an aperture configured to accept the microprocessor therethrough.

2. The assembly of claim 1 wherein said motherboard further comprises a socket configured to receive said substrate assembly.

3. The assembly of claim 1 wherein said voltage regulation circuit board further comprises a circuit for supplying power to the microprocessor.

4. The assembly of claim 1 wherein said voltage regulation circuit board further comprises passive power conditioning circuitry.

5. The assembly of claim 1 wherein said voltage regulation circuit board further comprises a power delivery module for converting a low current high voltage signal to a low voltage high current signal.

6. A modular power delivery system comprising:
a voltage regulation circuit board having a first side and a second side;
an interface board assembly having a first side and a second side and including a microprocessor mounted on said first side of said interface board assembly said interface board assembly being mechanically and electronically coupled to said voltage regulation circuit board with said first side of said substrate assembly facing said second side of said voltage regulation circuit board; and
a motherboard electronically and mechanically coupled to said interface board assembly;
wherein the voltage regulation circuit board further comprises an aperture configured to accept the microprocessor therethrough.

7. The assembly of claim 6 wherein said voltage regulation circuit board further comprises a circuit for supplying power to the microprocessor.

8. The assembly of claim 6 wherein said voltage regulation circuit board further comprises passive power conditioning circuitry.

9. The assembly of claim 6 wherein said voltage regulation circuit board further comprises a power delivery module for converting a low current high voltage signal to a low voltage high current signal.

10. A modular power delivery system comprising:
a power regulation circuit board having a power conditioning circuit, a first side and a second side;
a substrate assembly having a first side and a second side and including a microprocessor coupled to said first side of said substrate assembly, said substrate assembly being electrically coupled to said power regulation circuit board with said first side of said substrate assembly facing said second side of said power regulation circuit board; and
a motherboard electronically and mechanically coupled to said substrate assembly;
wherein the power regulation circuit board further comprises an aperture configured to accept the microprocessor therethrough.

11. The system of claim 10 wherein said motherboard further comprises a socket configured to receive said substrate assembly.

12. The system of claim 10 wherein said power regulation circuit board further comprises a circuit for supplying power to the microprocessor.

13. The system of claim 10 wherein said power regulation circuit board further comprises passive power conditioning circuit.

14. The system of claim 10 wherein said power regulation circuit board further comprises a power delivery module for converting a low current high voltage signal to a low voltage high current signal.

* * * * *